(12) United States Patent
Chung

(10) Patent No.: US 8,502,186 B2
(45) Date of Patent: Aug. 6, 2013

(54) SEMICONDUCTOR MEMORY DEVICE

(75) Inventor: Sung-Woong Chung, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 63 days.

(21) Appl. No.: 13/304,580

(22) Filed: Nov. 25, 2011

(65) Prior Publication Data

US 2012/0286227 A1    Nov. 15, 2012

(30) Foreign Application Priority Data

May 12, 2011    (KR) .................. 10-2011-0044642

(51) Int. Cl.
 *H01L 47/00* (2006.01)
 *H01L 27/108* (2006.01)
 *H01L 29/82* (2006.01)
(52) U.S. Cl.
 USPC ........ 257/4; 257/295; 257/314; 257/E27.084; 257/E47.001; 257/E29.323

(58) Field of Classification Search
 USPC ............. 257/4, 295, 314, E27.084, E29.323, 257/E47.001
 See application file for complete search history.

(56) References Cited

FOREIGN PATENT DOCUMENTS

| KR | 1019990080091 | 11/1999 |
| KR | 1020090105698 | 10/2009 |
| KR | 1020100129579 | 12/2010 |

OTHER PUBLICATIONS

Notice of Allowance issued by the Korean Intellectual Property Office on Dec. 20, 2012.

*Primary Examiner* — Victor A Mandala
*Assistant Examiner* — Whitney T Moore
(74) *Attorney, Agent, or Firm* — IP & T Group LLP

(57) ABSTRACT

A semiconductor memory device includes an isolation layer formed in a substrate and defining an active region, a trench formed in the substrate and defining a part of the active region as an active pillar; a word line formed inside the trench, a sub-source line formed under the trench and crossing the word line, a main source line formed over the substrate, coupled to the sub-source line, and crossing the word line, a variable resistor pattern formed over the active pillar, and a bit line contacting the variable resistor pattern and crossing the word line.

17 Claims, 29 Drawing Sheets

US 8,502,186 B2

SEMICONDUCTOR MEMORY DEVICE

CROSS-REFERENCE TO RELATED APPLICATIONS

The present application claims priority of Korean Patent Application No. 10-2011-0044642, filed on May 12, 2011, which is incorporated herein by reference in its entirety.

BACKGROUND

1. Field

Exemplary embodiments of the present invention relate to fabrication technology of a semiconductor device, and more particularly, to a semiconductor memory device having a cell structure suitable for high integration and a method for fabricating the same.

2. Description of the Related Art

A semiconductor device using resistance variation for storing data such as ReRAM (Resistive Random Access Memory) is being developed as a substitute for DRAM and flash memory devices. A semiconductor memory device using resistance variation for data storage may include switching elements and variable resistor elements. Furthermore, the semiconductor memory device includes word lines, bit lines, and source lines which couple the switching elements and the variable resistor elements.

In a conventional semiconductor memory device, planar transistors which have the source and drain regions positioned on a same plane are used as the switching elements. In this case, since a bit line and a source line are to be coupled to planar transistors, a cell size to $6F^2$ or less is hard to achieve. Accordingly, there is a limit in increasing the integration degree of the semiconductor memory device and reduction in production costs.

When source lines are arranged in parallel to word lines and arranged to cross bit lines, a signal may be transmitted to all memory cells coupled to a word line through one source line. Here, a voltage drop may occur and cause deterioration in interconnection reliability. Thus, operation characteristics of the semiconductor memory device may deteriorate.

To address such features, source lines may be arranged in parallel to bit lines and cross the word lines. In such a case, cell sizes may increase, and additional complexity in the structure of the semiconductor memory device may occur in arranging the source lines within a semiconductor memory device.

SUMMARY

An embodiment of the present invention is directed to a highly-integrated semiconductor memory device and a method for fabricating the same.

In accordance with an embodiment of the present invention, a semiconductor memory device includes: an isolation layer formed in a substrate and defining an active region; a trench formed in the substrate and defining a part of the active region as an active pillar; a word line formed inside the trench; a sub-source line formed under the trench and crossing the word line; a main source line formed over the substrate, coupled to the sub-source line, and crossing the word line; a variable resistor pattern formed over the active pillar; and a bit line contacting the variable resistor pattern and crossing the word line.

In accordance with another embodiment of the present invention, a semiconductor memory device includes: an isolation layer formed in a substrate and defining an active region; a trench formed in the substrate and defining a part of the active region as an active pillar; a word line formed inside the trench; a plurality of sub-source lines formed under the trench and arranged to each provide a source line voltage to a subset of a set of memory cells; and a main source line formed over the trench coupled to each of the sub-source lines, wherein the main source line provides the source line voltage to each of the sub-source lines.

DETAILED DESCRIPTION

Figure 1A:
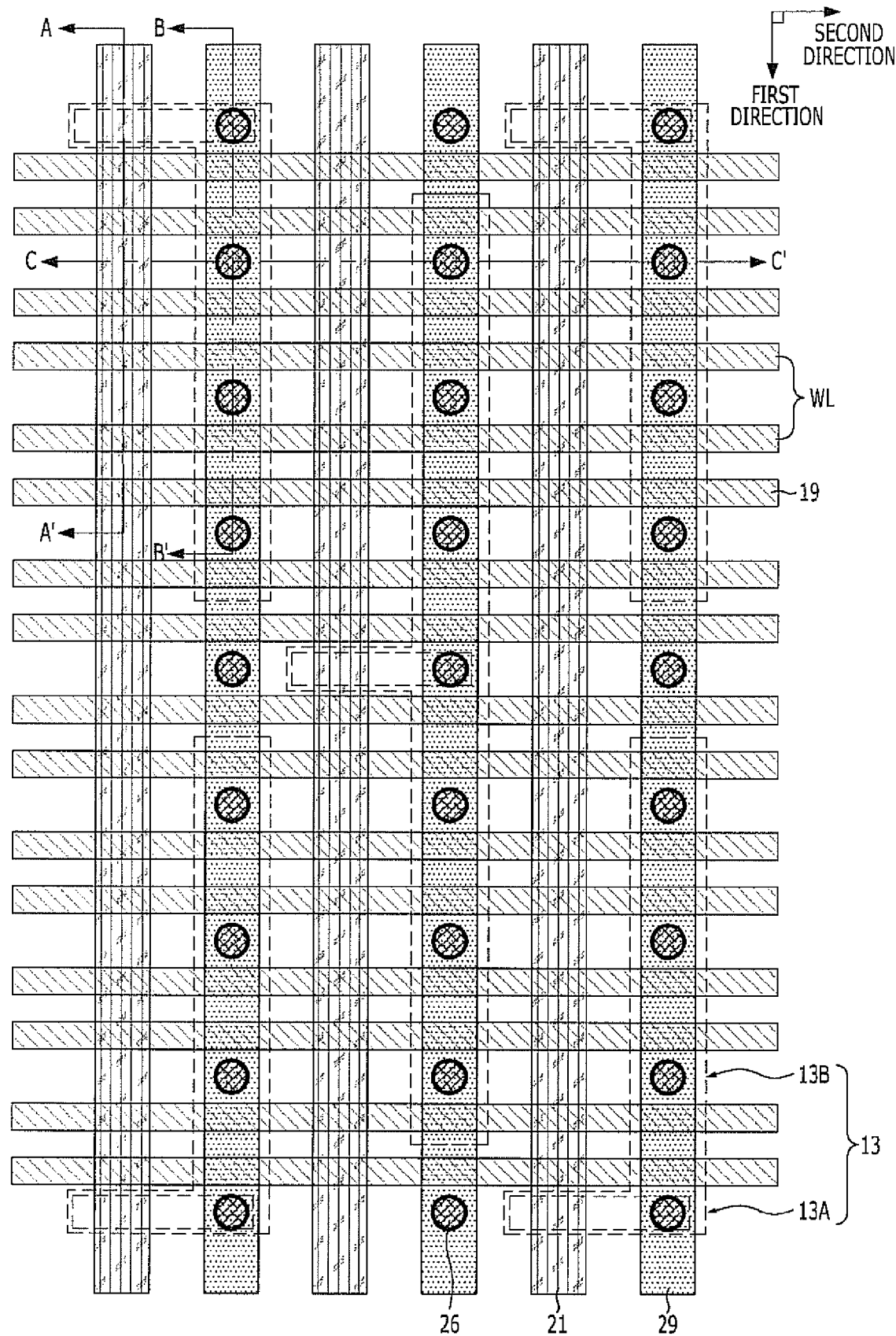
FIGS. 1A to 1E are diagrams illustrating a semiconductor memory device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Exemplary embodiments of the present invention provide a semiconductor memory device having a cell size of $6F^2$ or less (for example, $4F^2$) and a method for fabricating the same. More specifically, exemplary embodiments of the present invention provide a semiconductor memory device which employs vertical transistors having a channel formed in a vertical direction as switching elements and which has source lines arranged in parallel to bit lines and arranged to cross word lines and a method for fabricating the same.

Figure 1B:
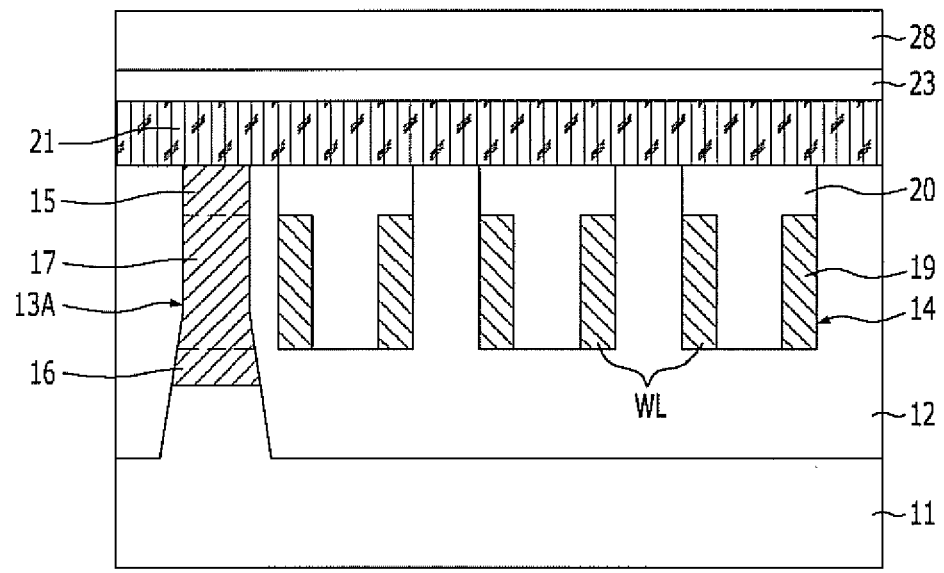
Figure 1C:
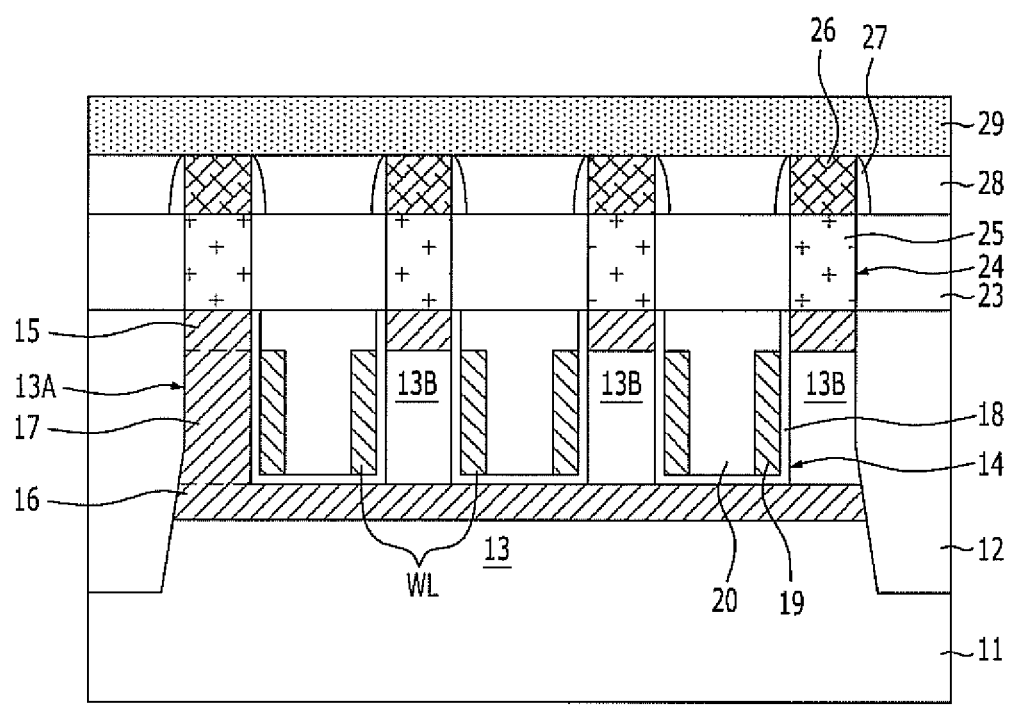
Figure 1D:
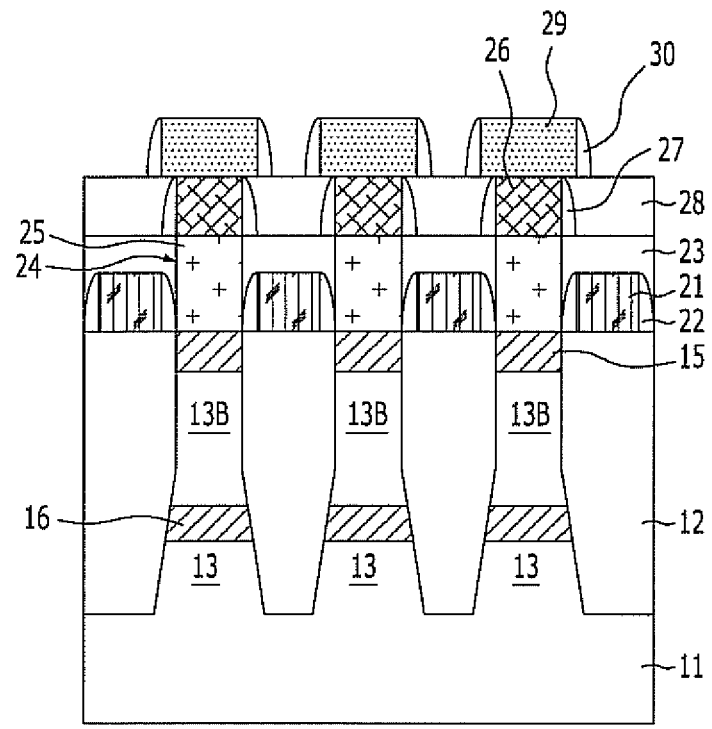
Figure 1E:
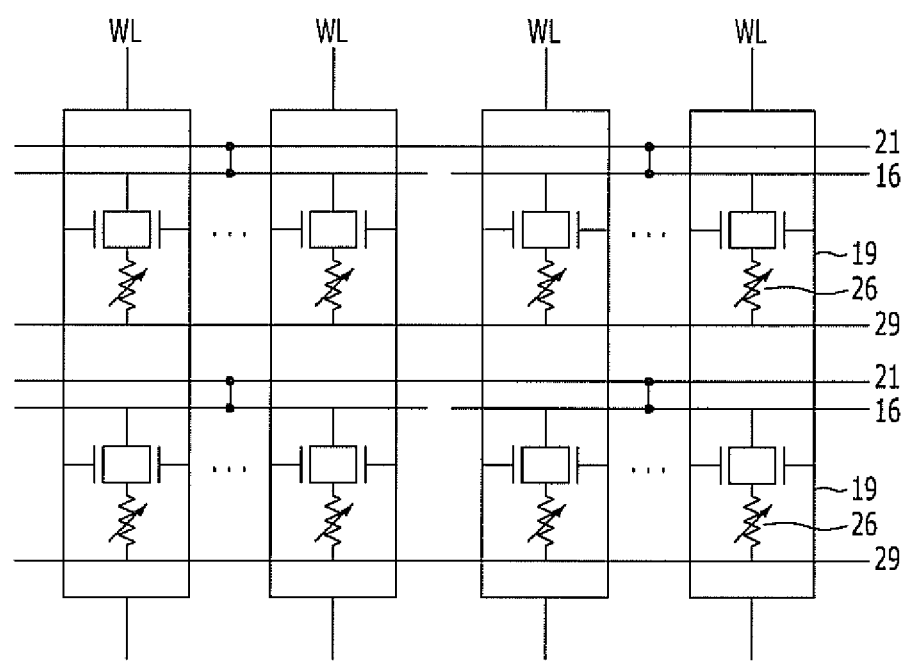

FIGS. 1A to 1E are diagrams illustrating a semiconductor memory device in accordance with a first embodiment of the present invention. More specifically, FIG. 1A is a plan view, FIGS. 1B to 1D are cross-sectional views along a line A-A', a line B-B', and a line C-C' of FIG. 1A, respectively, and FIG. 1E is a circuit diagram.

Referring to FIGS. 1A to 1E, the semiconductor memory device in accordance with the first embodiment of the present invention includes an isolation layer 12 (e.g., FIG. 1B), a trench 14, a gate electrode 19, a sub-source line 16 to provide a source line voltage to a subset of memory cells, a main source line 21 to provide the source line voltage to a plurality of sub-source lines 16, a variable resistor pattern 26, and a bit line 29. The isolation layer 12 is formed in a substrate 11 to define an active region 13. The trench 14 is formed in the substrate 11 to define an active pillar 13B. The gate electrode 19 is formed on the sidewalls of the trench 14. The sub-source line 16 is formed in the substrate 11 under the gate electrode 19 so as to cross the gate electrode 19. The main source line 21 is formed over the substrate 11 so as to cross the gate electrode 19. The variable resistor pattern 26 is formed on the active pillar 13B. The bit line 29 is formed over the variable resistor pattern 26 and crosses the gate electrode 19.

The isolation layer 12 may be formed through a shallow trench isolation (STI) process and defines the active region 13 formed a line extended in a first direction (shown in FIG. 1A). At this time, the isolation layer 12 may further define an active tap 13A coupled to one end of the active region 13. The active tap 13A is formed to provide a space in which a second impurity region 17 for electrically coupling the sub-source line 16 to the main source line 21 is to be formed. The active tap 13A may protrude from the active region 13 in a second region so as to overlap the main source line 21.

The trench 14 may include a line pattern which pattern crosses both of the active region 13 and the isolation layer 12, where each trench 14 extends in the second direction (shown in FIG. 1A). At this time, the active region 13 includes a region where the active pillar 13B is defined by the trench 14 and the isolation layer 12. With respect to the upper surface of the substrate 11, the depth of the trench 14 may be set to be smaller than the thickness of the isolation layer 12. Depending on the depth of the trench 14, the channel length of the vertical transistor serving as a switching element is determined.

The gate electrode 19 formed on the sidewalls of the trench 14 may include a line pattern extended in the second direction. At this time, a gate dielectric layer 18 is formed on the surface of the trench 14, and a sealing layer 20 is buried in the trench 14 including the gate electrode 19. The sealing layer 20 protects the gate electrode 19 and electrically isolates gate electrode 19 from the adjacent gate electrode 19 on the opposite side of the trench 14, where the sealing layer includes an insulation layer.

On the surface of the active pillar 13B, a first impurity region 15 serving as a junction region is formed. The upper surface of the gate electrode 19 may be lower than the upper surface of the substrate 11 in height such that the gate electrode 19 partially overlaps the first impurity region 15. With such an arrangement, the structure formed over the substrate 11 is more effectively insulated from the gate electrode 19. Further, the overlapping area between the gate electrode 19 and the first impurity region 15 serving as a junction region is minimized to substantially prevent an occurrence of a leakage current therebetween. The gate electrode 19 may include a single layer formed of a silicon layer or metallic layer or a stacked layer of a silicon layer and a metallic layer. According to an example, the metallic layer includes a metal layer, a metal oxide layer, a metal nitride layer, and a metal silicide layer.

Two gate electrodes 19 formed on both sidewalls of the active pillar 13B in the first direction serve as a word line WL, where each gate electrode 19 operates as a gate electrode of an access transistor to a memory cell as shown in FIG. 1E and together operates as a gate electrode unit for performing the foregoing function. Therefore, the word line WL forms a structure that surrounds both sidewalls of the respective active pillars 13B arranged on the same line and extends in the second direction. Here, a gate electrode 19 formed on a sidewall of the trench 14 and a gate electrode 19 formed on the other sidewall of the same trench 14 operate as different word lines WL.

The sub-source line 16 includes an impurity region which is formed by implanting ion impurities into the substrate 11. The sub-source line 16 extends in a direction crossing the active pillars 13B may also serve as a junction region. The sub-source line 16 has a line shape extended in the first direction. Here, the sub-source line 16 extends in a direction crossing the gate electrode 19, that is, the word line WL. The sub-source line 16 and another sub-source line 16 adjacent in the second direction are insulated by the isolation layer 12. The sub-source line 16 is used in providing a semiconductor memory device having a cell size of $4F^2$ and substantially prevents a voltage drop of the source line (sub-source line + main source line) and a reduction in interconnection reliability. According to an example, the sub-source line 16 may be disposed for each mat.

The main source line 21 includes a metallic layer, is configured to have lower resistance than the sub-source line 16, and serves to reduce the entire resistance of the source line. Accordingly, it is possible to effectively prevent a voltage drop of the source line and a reduction in interconnection reliability. The main source line 21 includes a line pattern extended in the first direction (that is, a direction parallel to the extended direction of the sub-source line 16), and may be disposed for each bank, because the main source line 21 has lower resistance than the sub-source line 16. More specifically, the main source line 21 may have a structure coupled to a plurality of sub-source lines 16 through the first and second impurity regions 15 and 16 formed in the active tap 13A. Between the main source line 21 and the first impurity region 15, an ohmic contact layer may be inserted to reduce contact resistance therebetween. While the ohmic contact layer is not illustrated in the drawings, it may include a metal silicide layer according to an example.

Over the entire surface of the substrate 11, a first interlayer dielectric layer 23 is formed to cover the main source line 21. The variable resistor pattern 26 is formed on the first interlayer dielectric layer 23. The variable resistor pattern 26 and the active pillar 13B are coupled to each other by a contact plug 25 passing through the first impurity region 12 and the first interlayer dielectric layer 23. Between the first impurity region 15 and the contact plug 25 and between the contact plug 25 and the variable resistor pattern 26, an ohmic contact layer may be inserted to reduce contact resistance therebetween. While the ohmic contact layer is not illustrated in the drawings, it may include a metal silicide layer according to an example.

The variable resistor pattern 26 may be any reasonably suitable resistor pattern capable of switching two resistance states according to a bias voltage (for example, an externally applied bias voltage). The variable resistor pattern 26 according to an example is described in detail with reference to FIGS. 10A to 10D.

On the first interlayer dielectric layer 23, a second interlayer dielectric layer 28 is formed to fill the space between the variable resistor patterns 26. On the second interlayer dielectric layer 28, a bit line 29 is formed over the variable resistor pattern 26. The bit line 29 is formed of a metallic layer and may form a line extended in the first direction. Between the bit line 29 and the variable resistor pattern 26, an ohmic contact layer may be inserted to reduce contact resistance therebetween. While the ohmic contact layer is not illustrated in the drawings, it may include a metal silicide layer according to an example.

The semiconductor memory device having the above-described structure is provided with the vertical transistor including the active pillar 13B, the gate electrode 19 formed on sidewalls of the active pillar 13B, the first impurity region 15 formed on the upper surface of the active pillar 13B, and the sub-source line 16 formed in the substrate 11 under the active pillar 13B. By using such a configuration, a semiconductor memory device having a cell size of $6F^2$ or less (for example, $4F^2$) may be formed. Furthermore, although the semiconductor memory device have a structure in which the sub-source line 16 and main source line 21 are arranged in parallel to the bit line 29 and arranged to cross the word line WL, the structure of the semiconductor memory device may be simplified while reducing the fabrication process complexity because the word line WL is buried in the substrate 11 and the sub-source line 16 and main source line 21 are provided. Accordingly, the integration degree of the semiconductor memory device may be increased, and the production cost may be reduced. Furthermore, in providing the vertical transistor, the operation characteristics of the semiconductor memory device may be substantially prevented from being degraded by a short channel effect, the driving speed of the semiconductor memory device may be increased, and the power consumption may be reduced.

Furthermore, the semiconductor memory device in accordance with the exemplary embodiment of the present invention includes the sub-source line 16 formed in the substrate 11 and the main source line 21 formed over the substrate 11. Therefore, since an electric current flows into the main source line 21 through the sub-source line 16 during a read/write operation based on signals (or voltages) applied to the word line WL and the bit line 29, a voltage drop and a reduction in interconnection reliability that may occur when all memory cells coupled to a word line WL receive signals through one source line during a read/write operation may be prevented. Furthermore, since the sub-source line 16 and main source line 21 are arranged in parallel to the bit line 29 and arranged to cross the word line WL, a voltage drop of the source line and a reduction in interconnection reliability may be prevented.

Figure 2A:
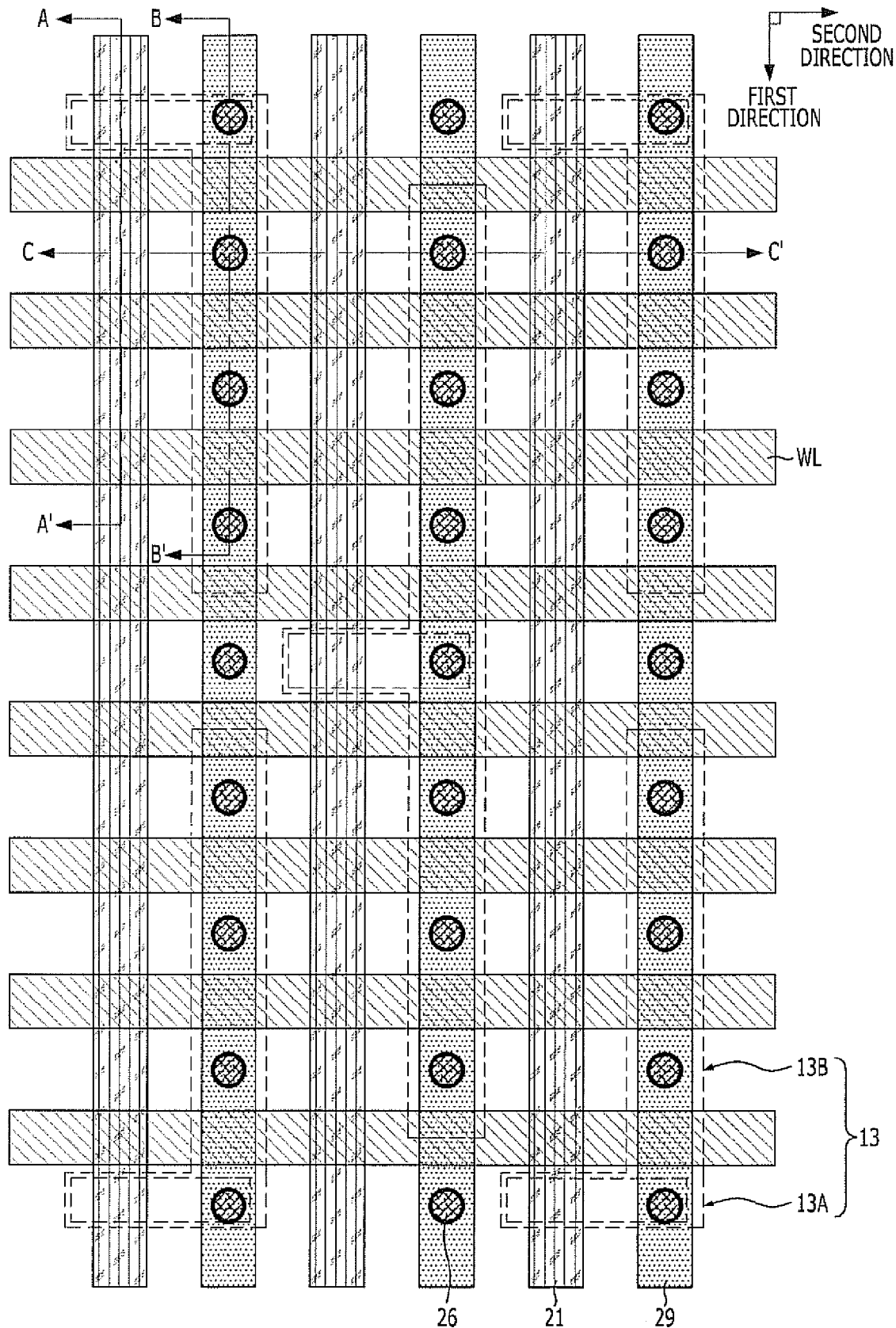
FIGS. 2A to 2E are diagram illustrating a semiconductor memory device in accordance with a second embodiment of the present invention.
Figure 2B:
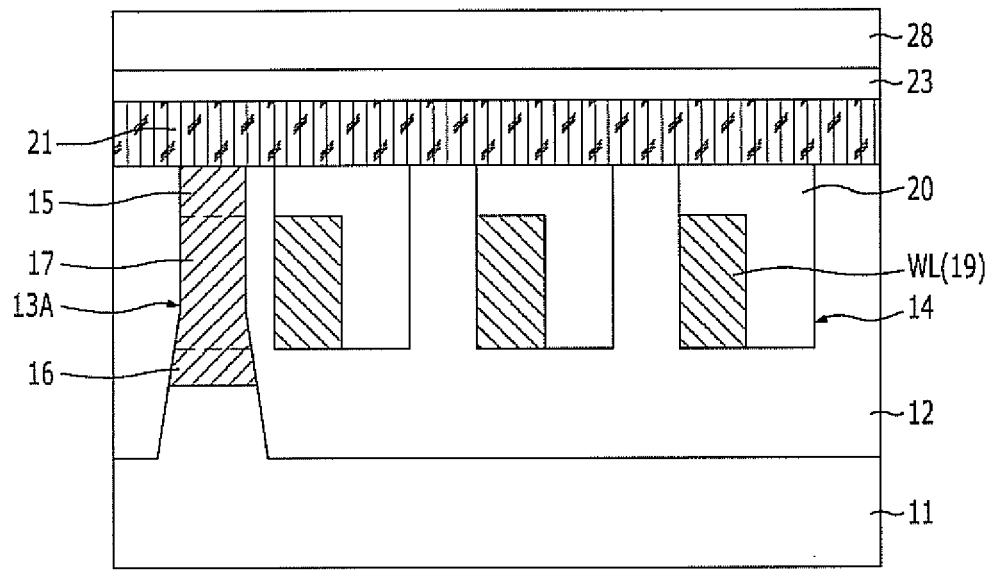
Figure 2C:
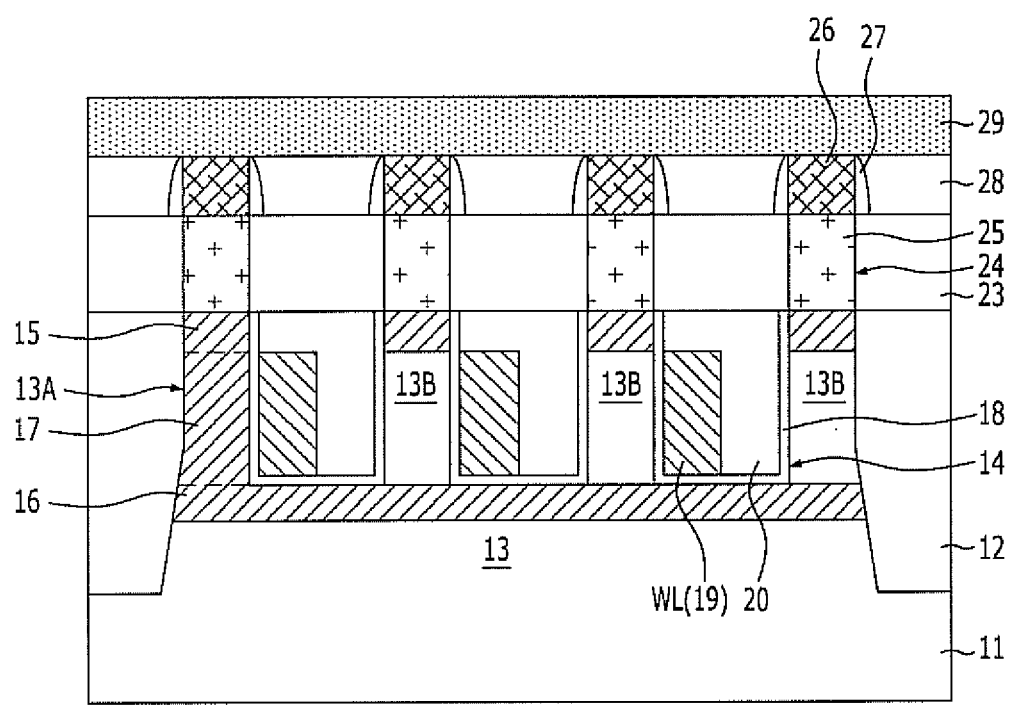
Figure 2D:
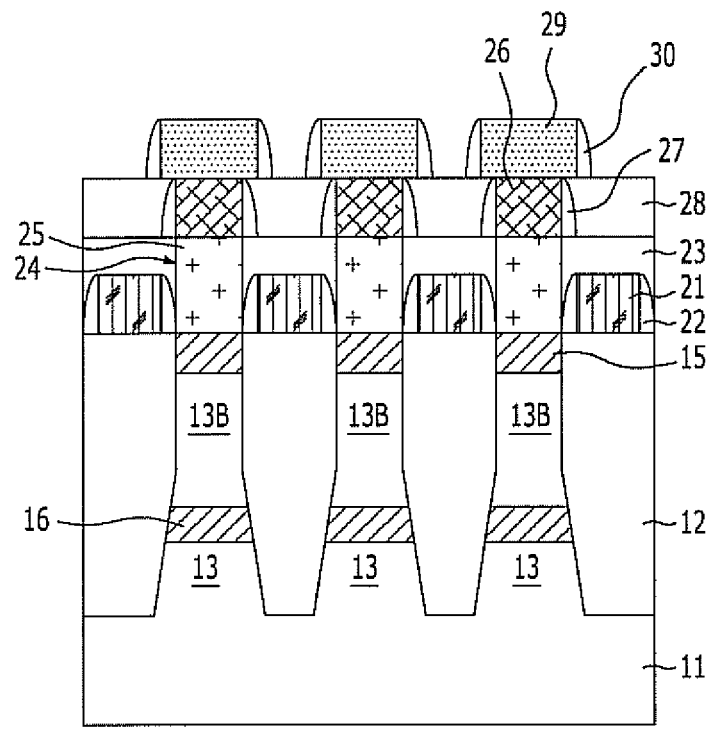
Figure 2E:
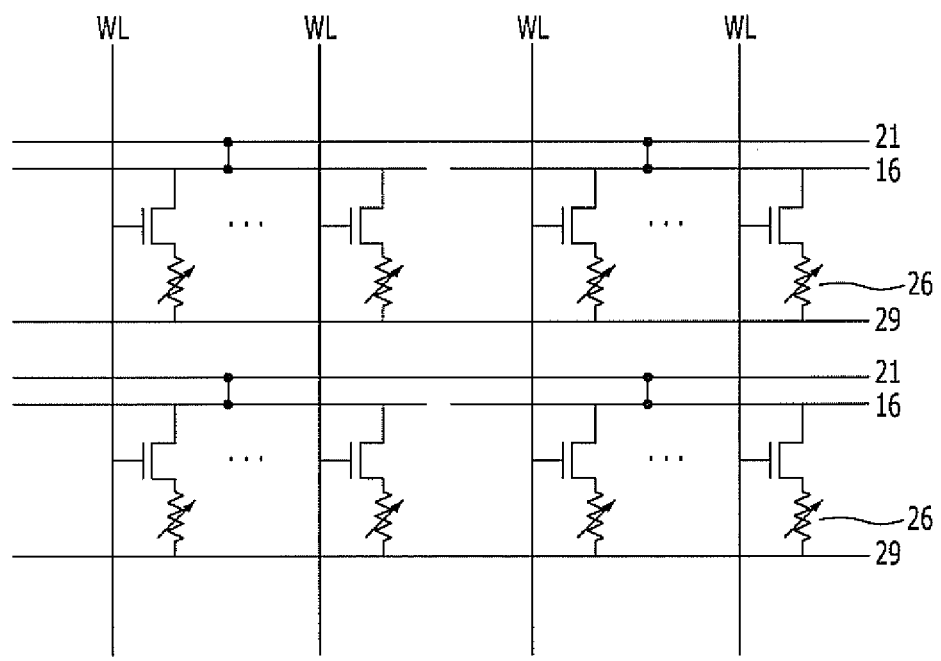

FIGS. 2A to 2E are diagrams illustrating a semiconductor memory device in accordance with a second embodiment of the present invention. FIG. 2A is a plan view, and FIGS. 2B to 2D are cross-sectional views along a line A-A', a line B-B', and a line C-C' of FIG. 2A, respectively. In the second embodiment of the present invention, the same reference numerals as those of the first embodiment of the present invention are used to refer to the same elements in both embodiments, and the detailed descriptions thereof are omitted as being redundant.

Referring to FIGS. 2A to 2E, the semiconductor memory device in accordance with the second embodiment of the present invention includes the same components as those of the first embodiment of the present invention, where the shape of the word line WL is different from that of the first embodiment of the present invention.

In accordance with the second embodiment of the present invention, the gate electrode 19 formed on a side of the active pillar 13B in the first direction serves as the word line WL. Therefore, the word line WL includes a line pattern extended in the second direction and has a structure that contacts sidewalls of the respective active pillars 13B arranged on the same line. As such, when the word line WL is formed to contact one side of the active pillar 13B, a process of designing and forming the word line WL may be more easily performed. Here, the structure of the semiconductor memory device may be further simplified than that of the first embodiment of the present invention so that the integration degree may be increased while reducing the production cost.

FIGS. 3 to 9 are diagrams illustrating a method for fabricating the semiconductor memory device in accordance with the first embodiment of the present invention. FIGS. 3A to 9A are plan views, and FIGS. 3B to 9B, FIGS. 3C to 9C, FIGS. 3D to 9D are cross-sectional views along lines A-A', lines B-B', and lines C-C' of FIGS. 3A to 9A, respectively.

Referring to FIGS. 3A to 3D, an isolation layer 12 (shown in FIG. 3B) is formed in a substrate 11 to define a plurality of active regions 13. The isolation layer 12 may be formed by the STI process.

Figure 3A:
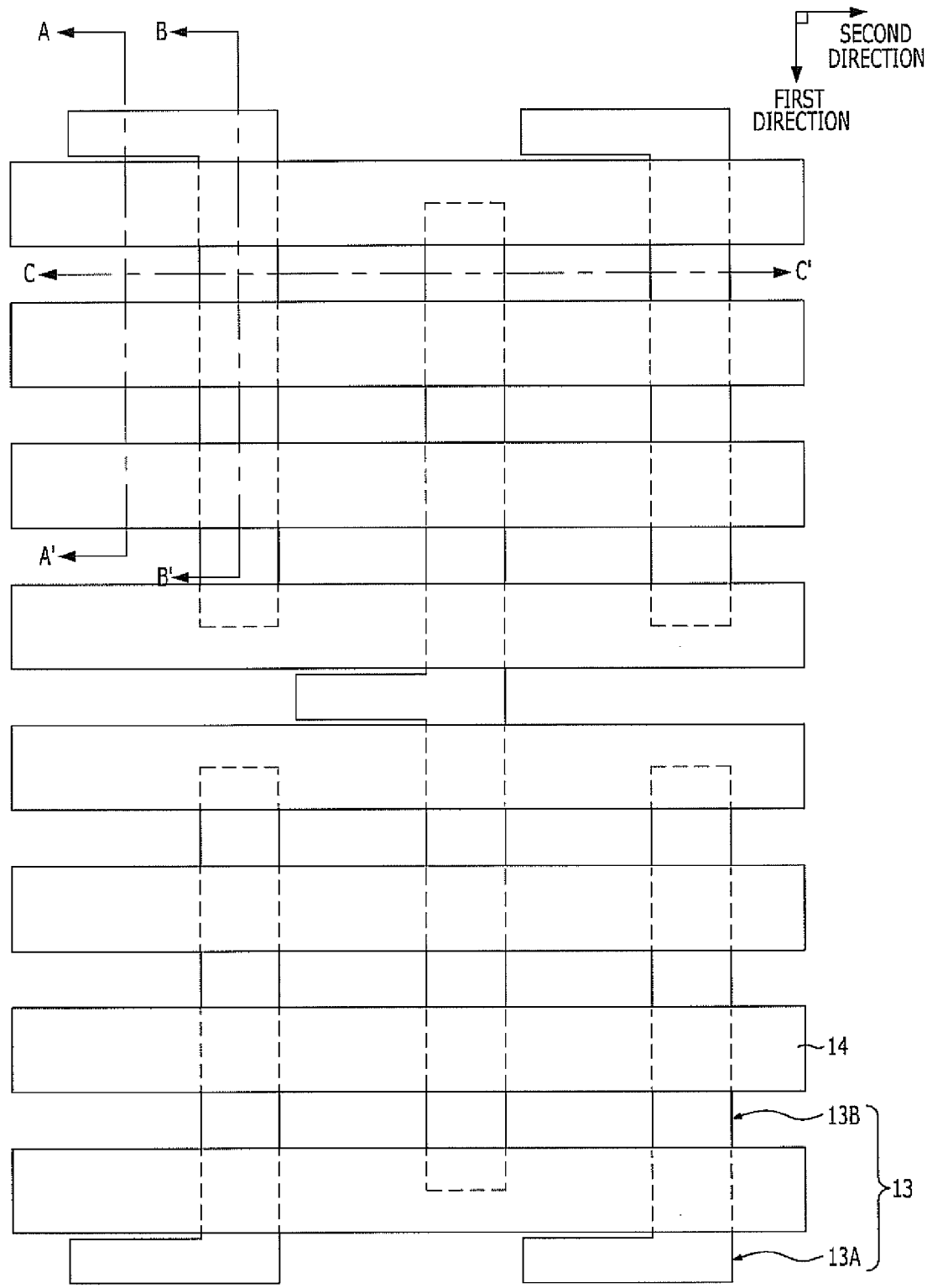
FIGS. 3A to 9D are diagrams illustrating a method for fabricating the semiconductor memory device in accordance with the first embodiment of the present invention.
Figure 3B:
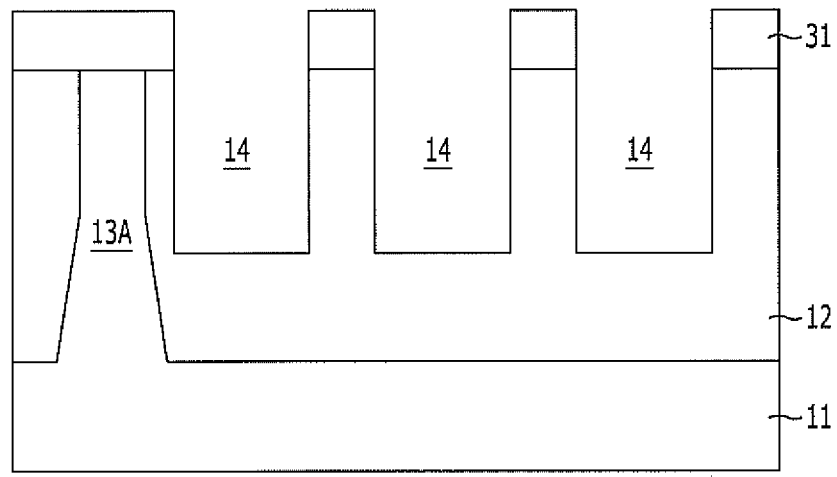
Figure 3C:
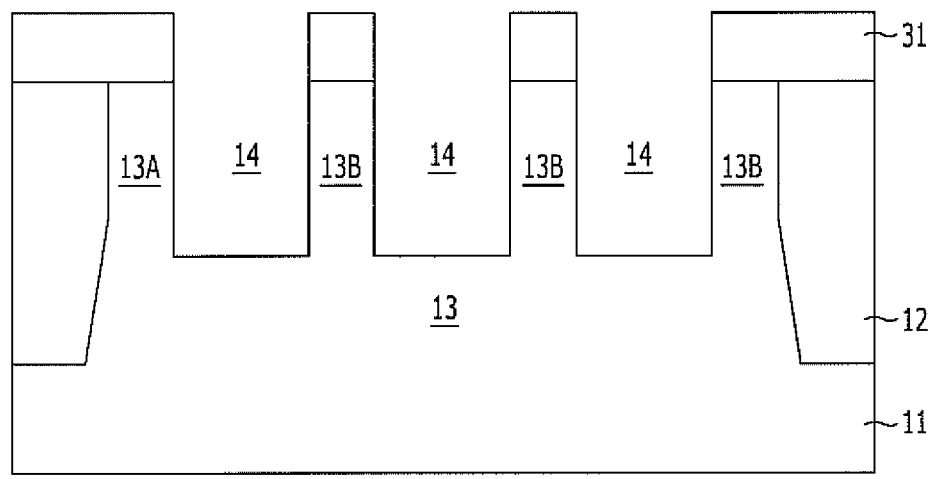
Figure 3D:
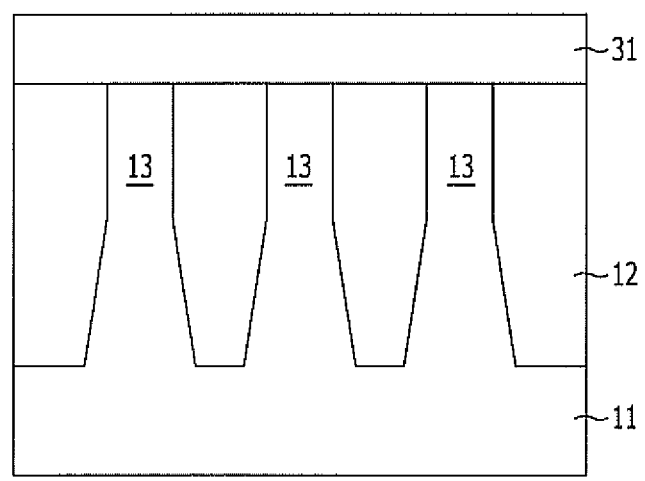
Figure 4A:
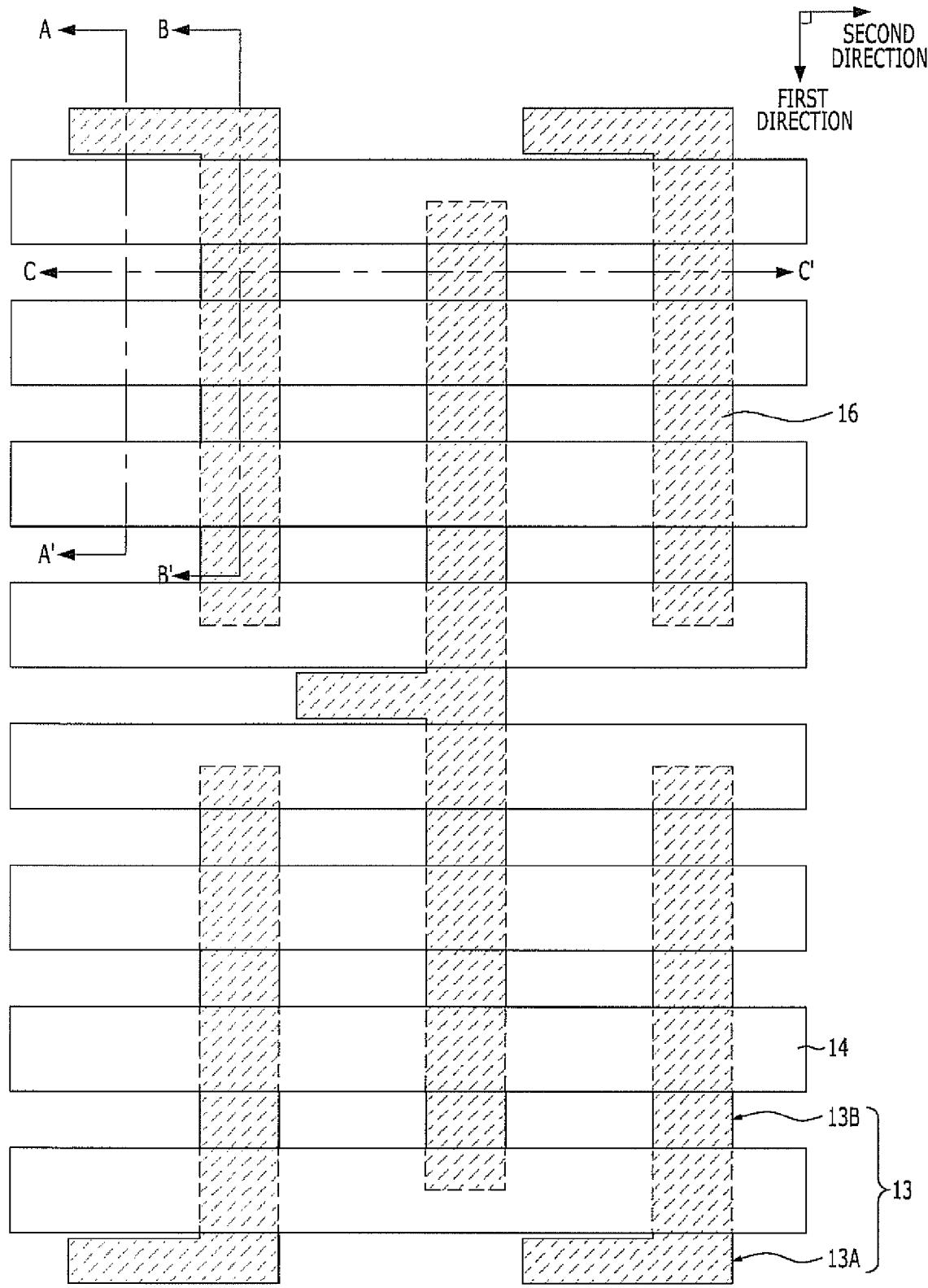
Figure 4B:
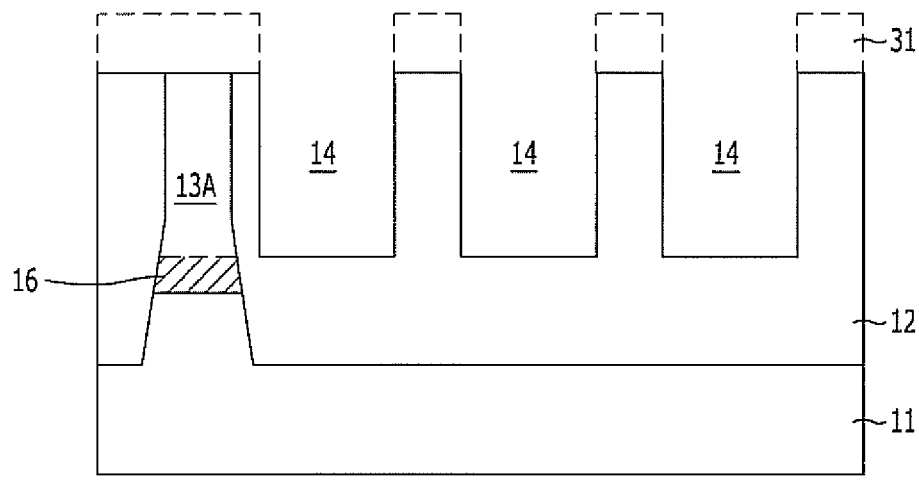
Figure 4C:
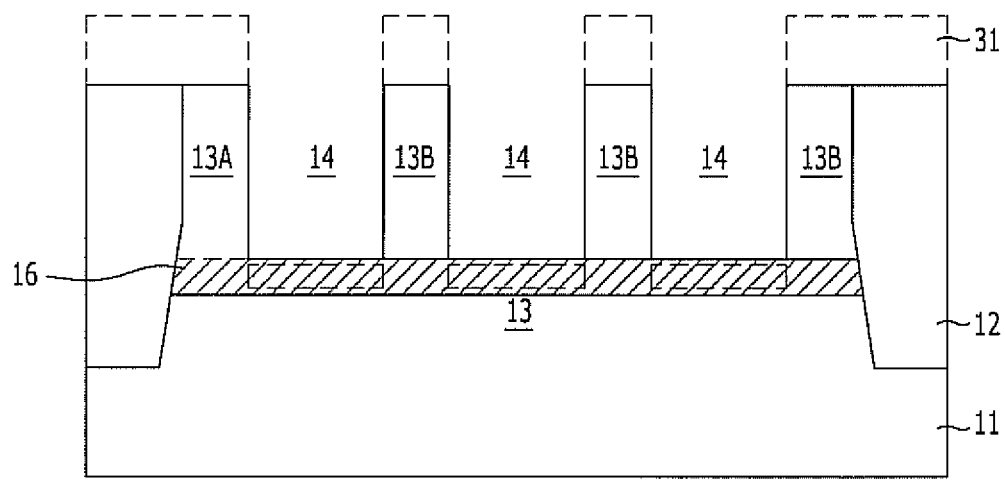
Figure 4D:
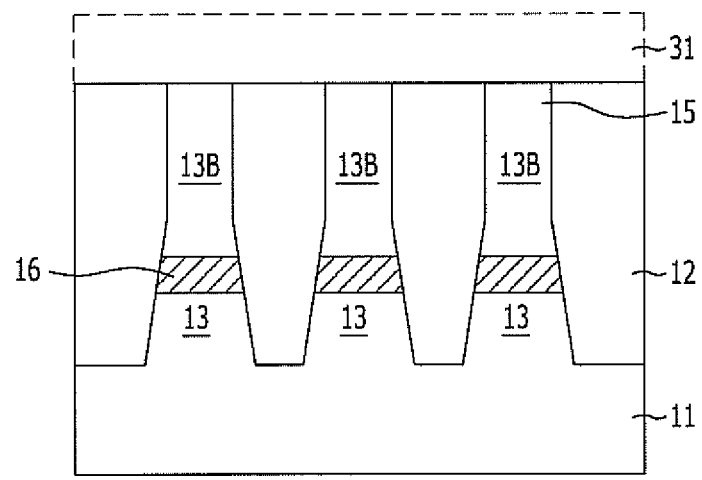
Figure 5A:
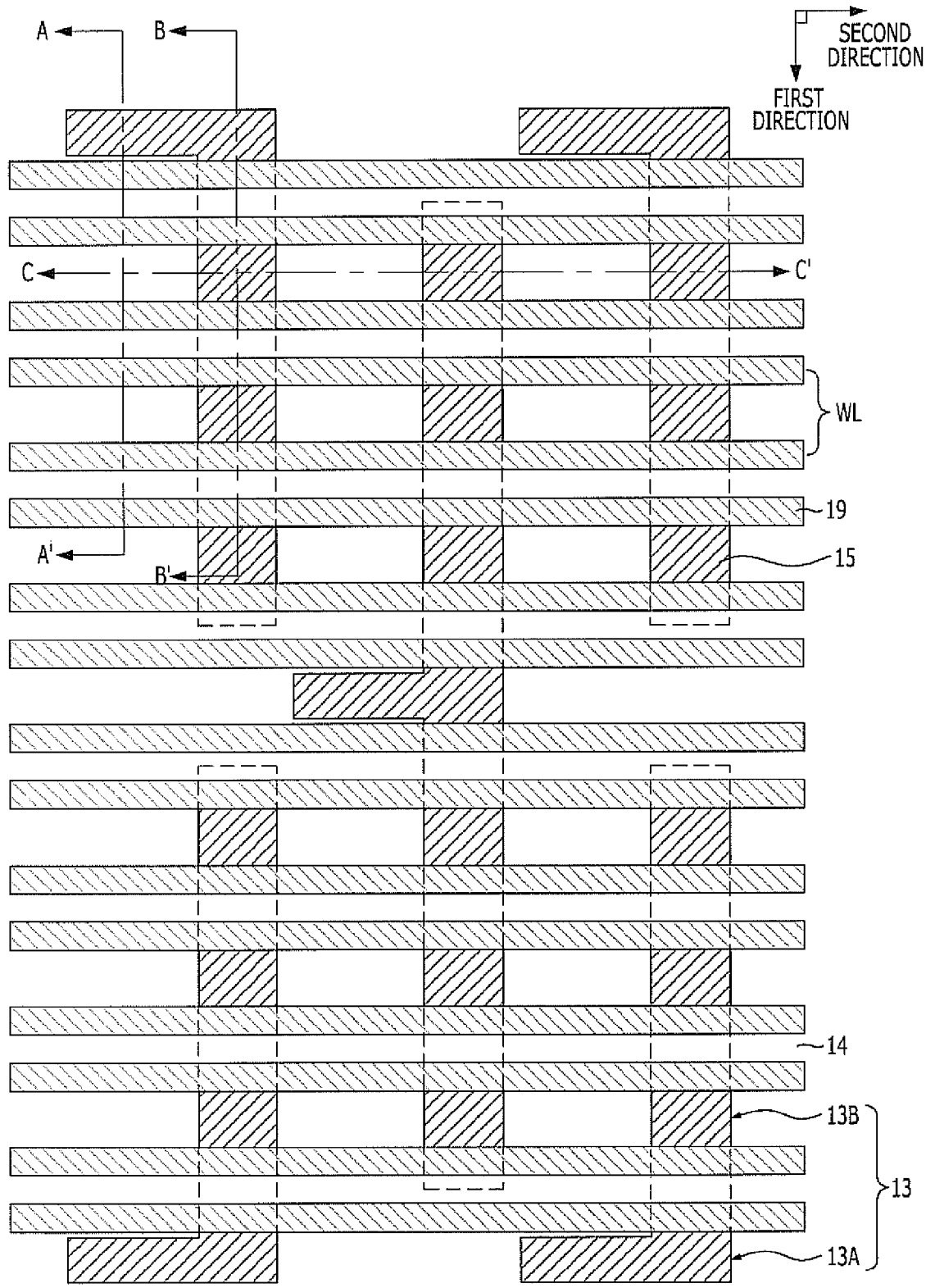
Figure 5B:
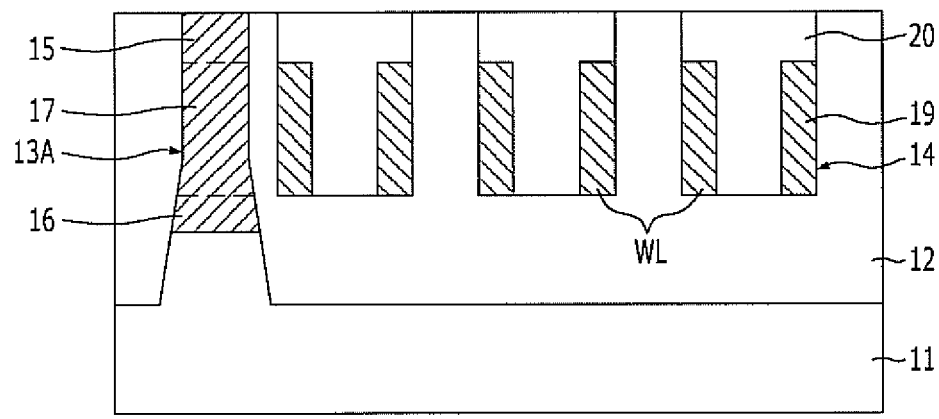
Figure 5C:
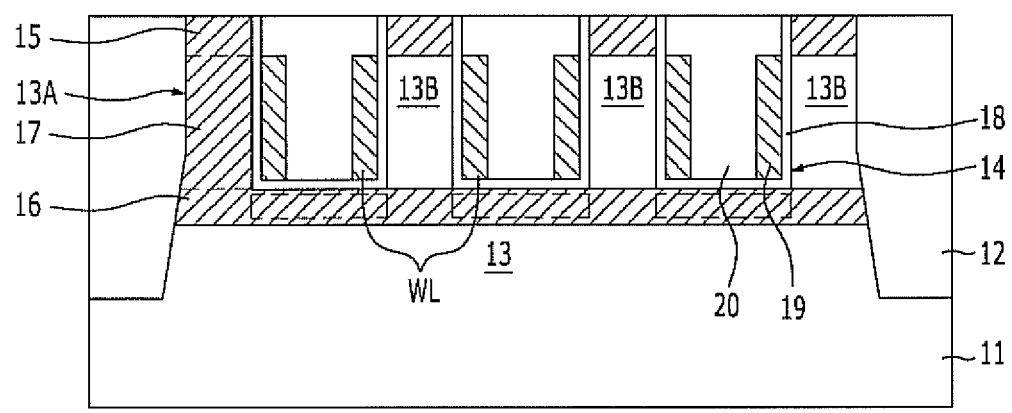
Figure 5D:
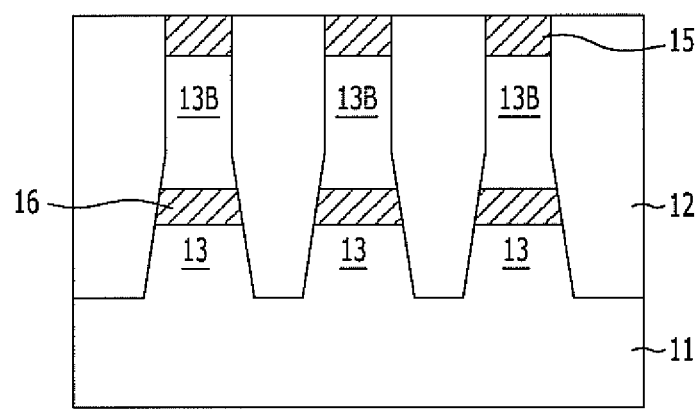
Figure 6A:
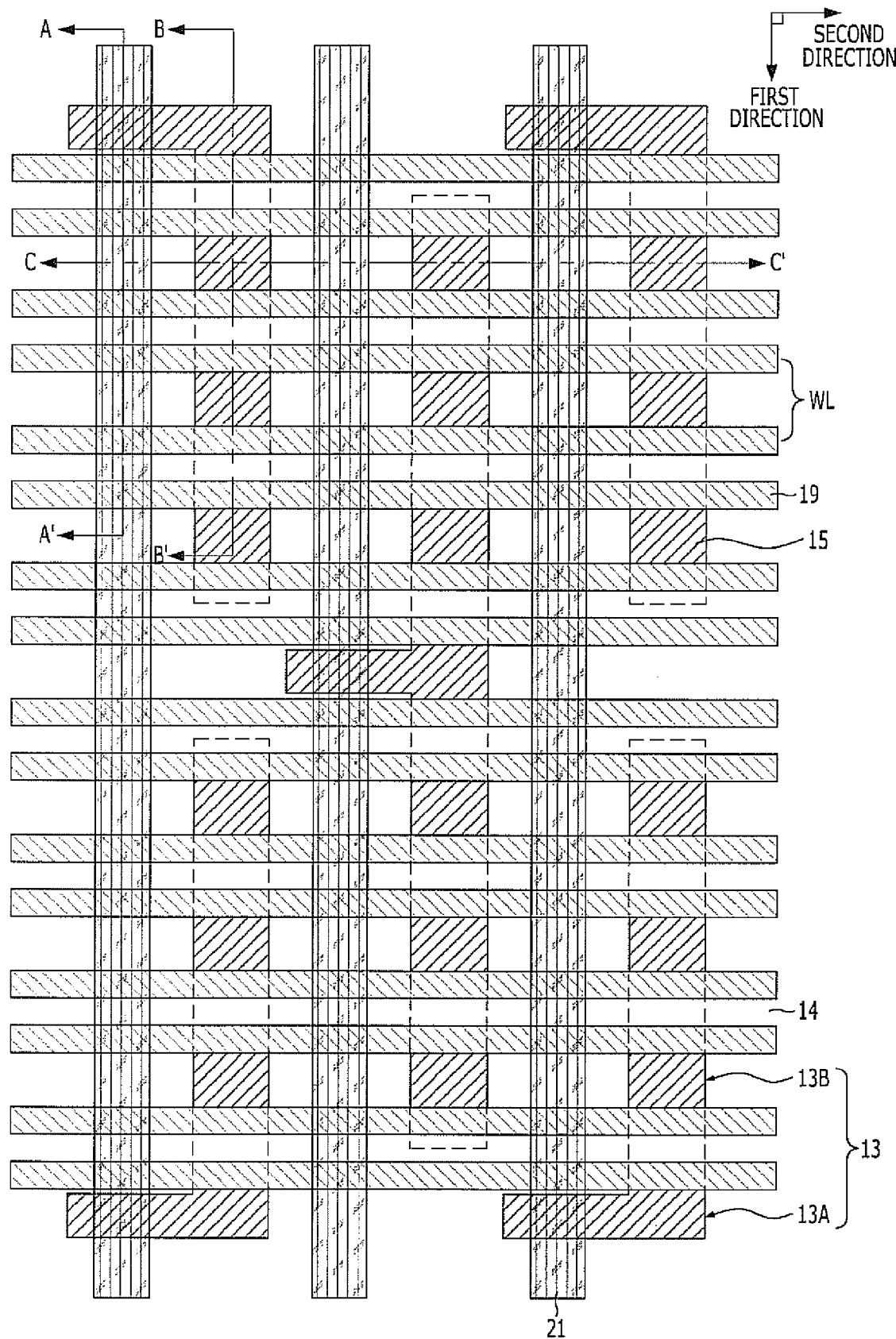
Figure 6B:
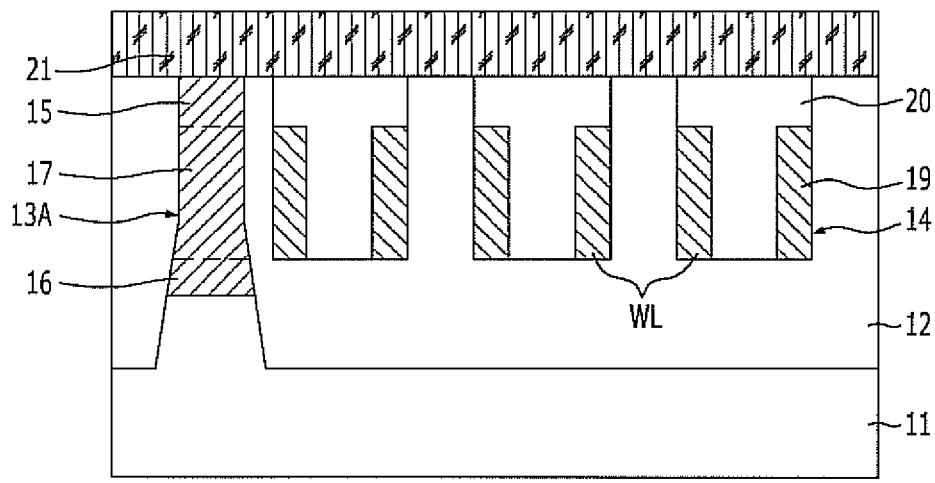
Figure 6C:
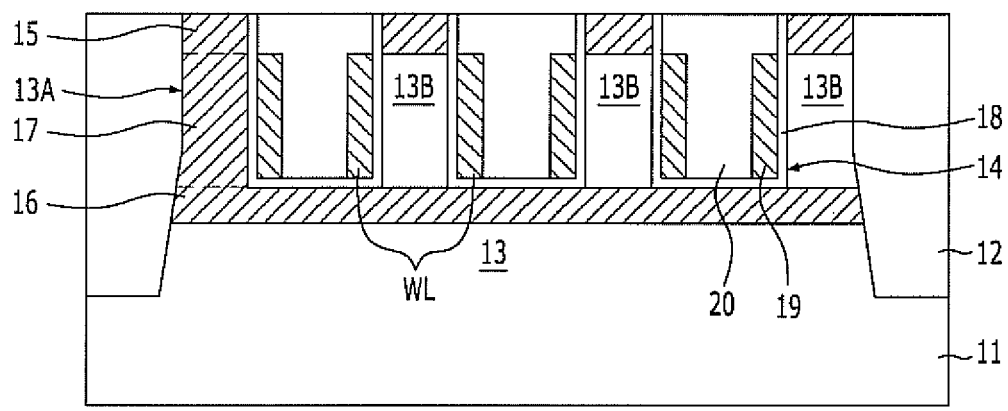
Figure 6D:
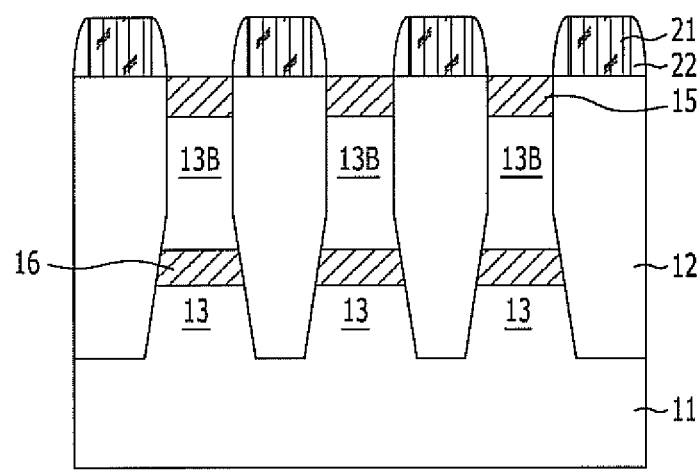
Figure 7A:
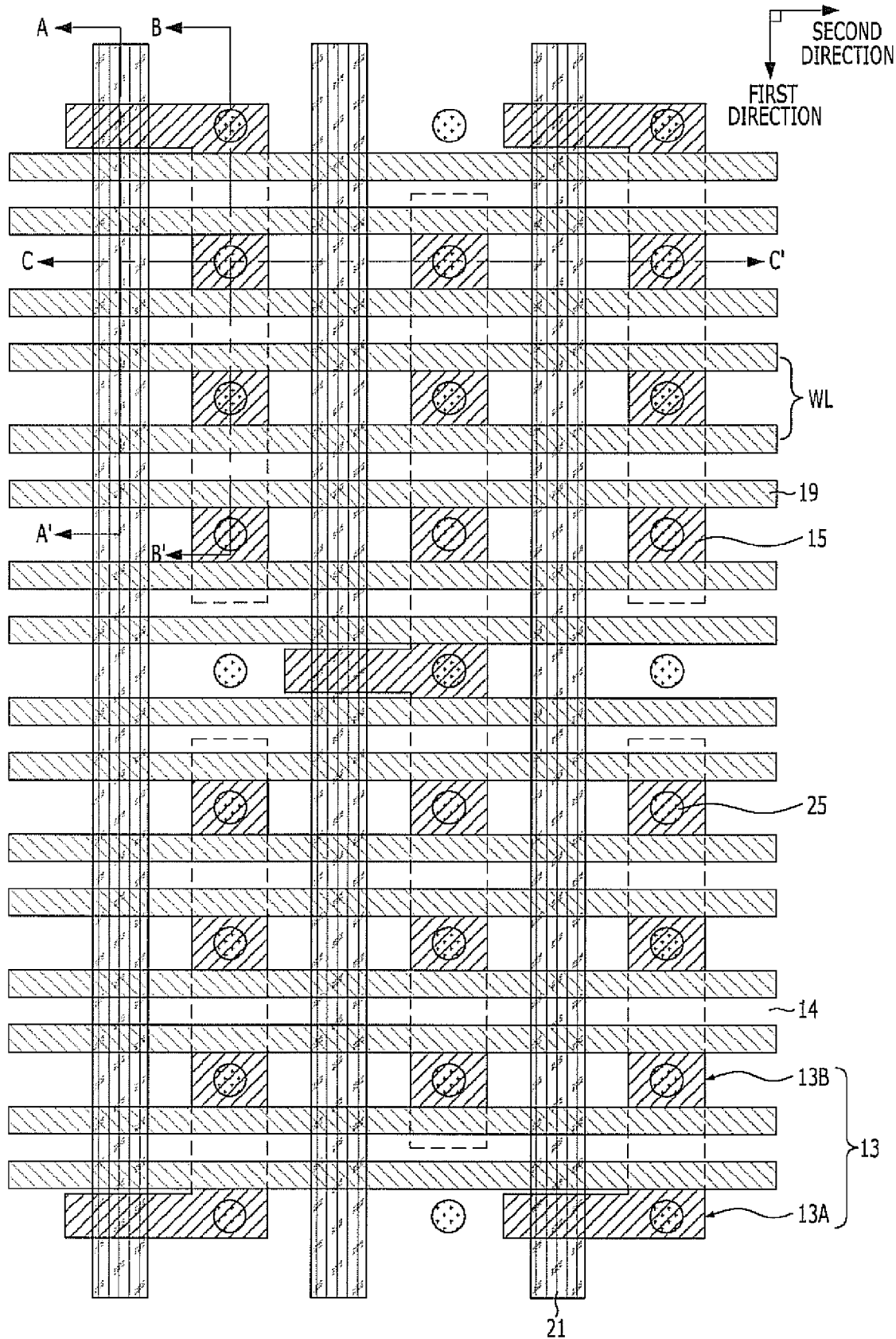
Figure 7B:
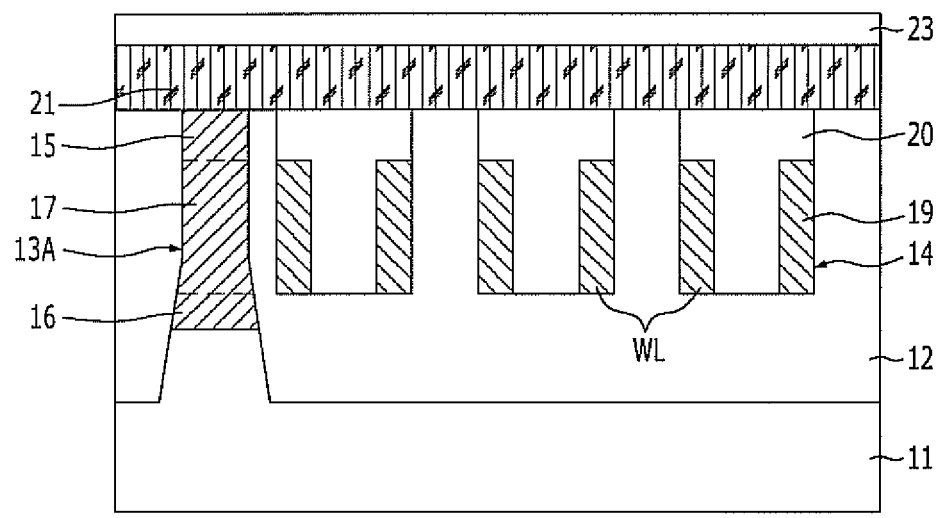
Figure 7C:
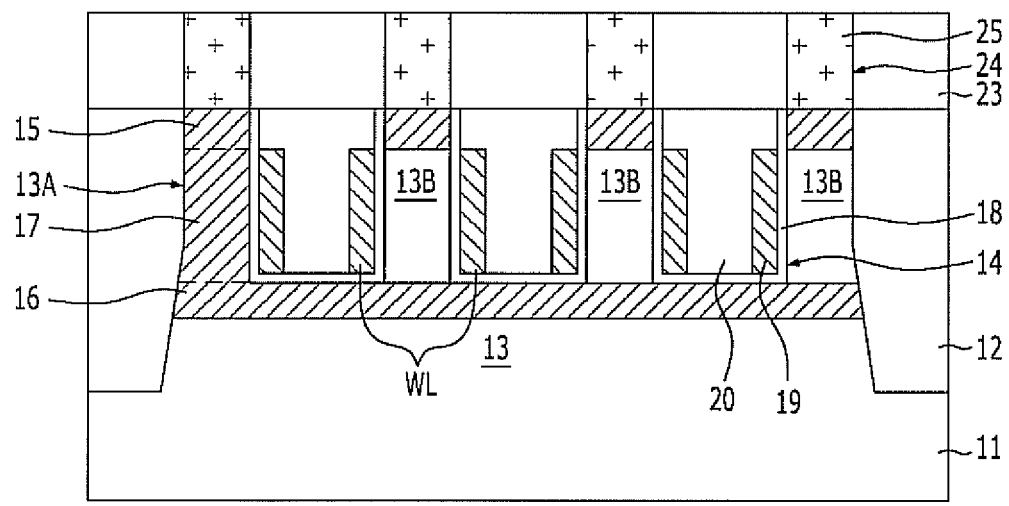
Figure 7D:
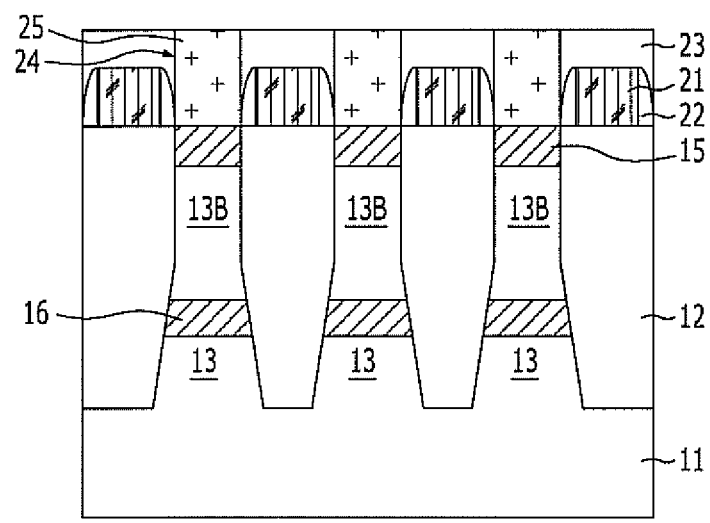
Figure 8A:
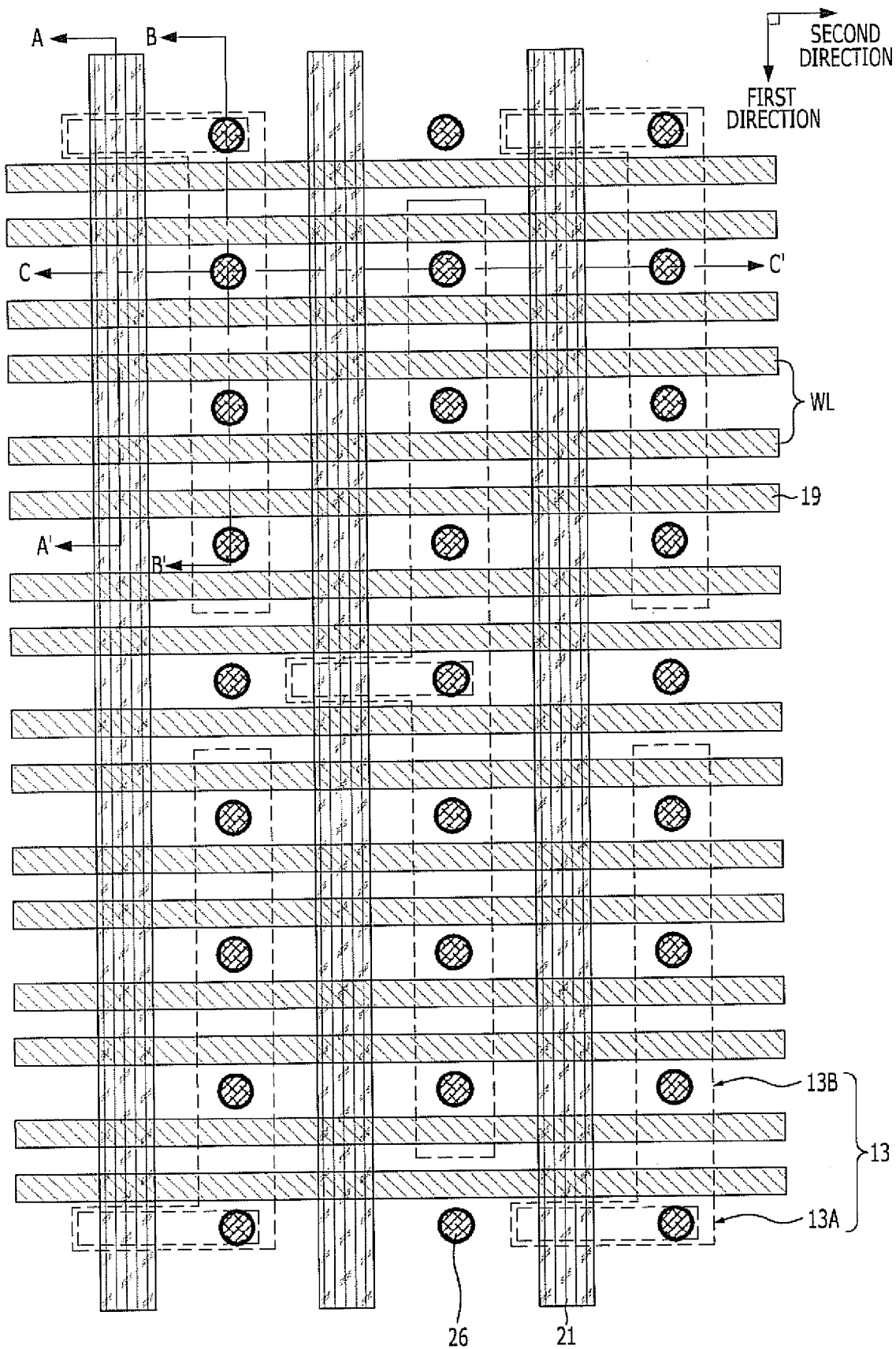
Figure 8B:
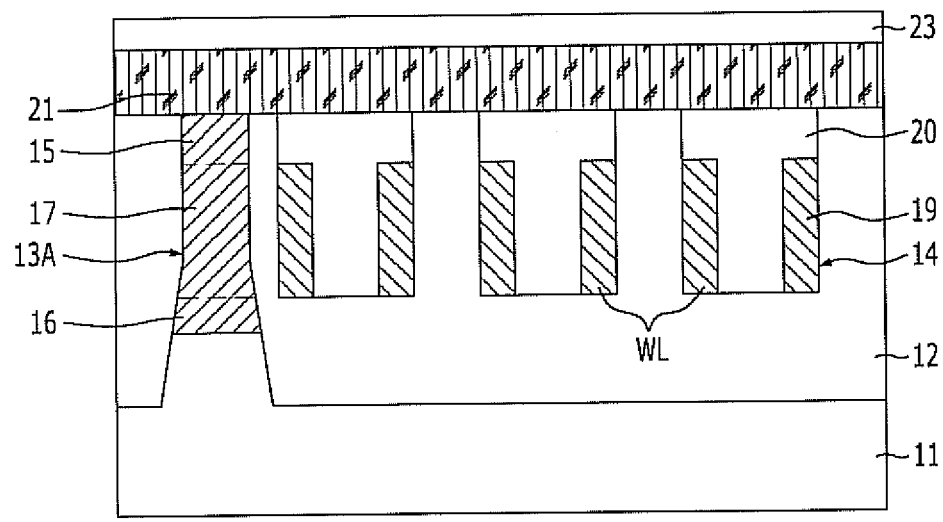
Figure 8C:
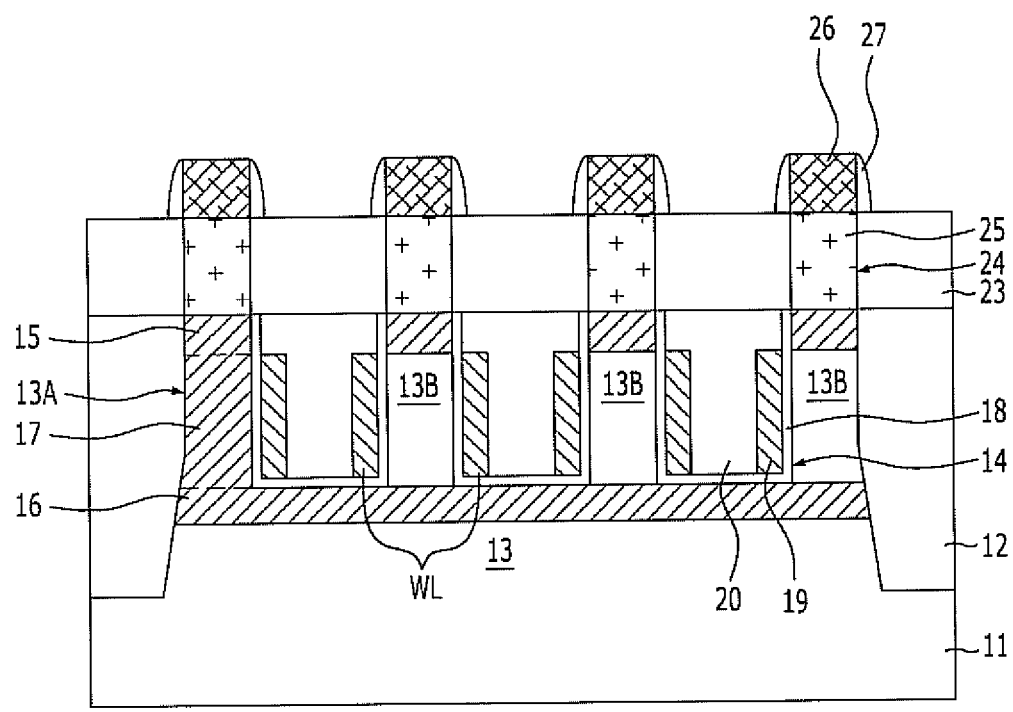
Figure 8D:
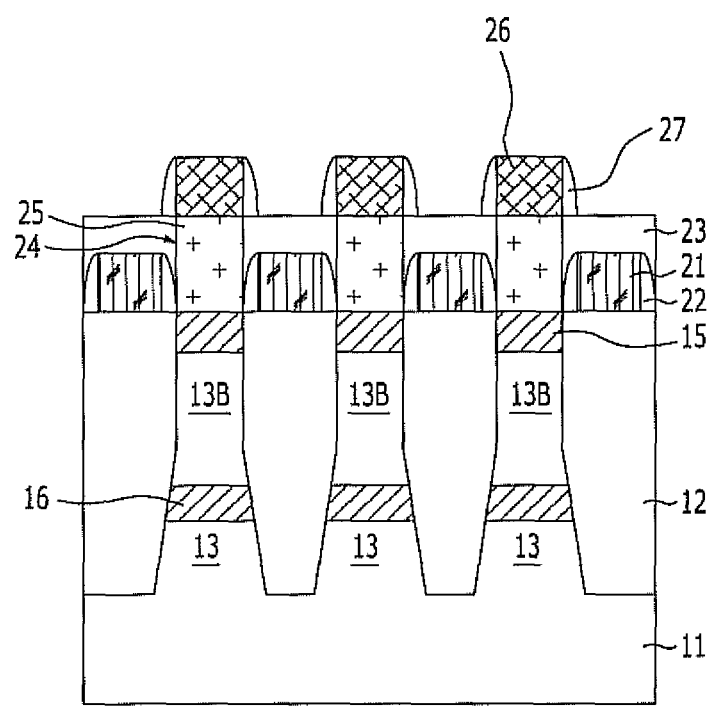
Figure 9A:
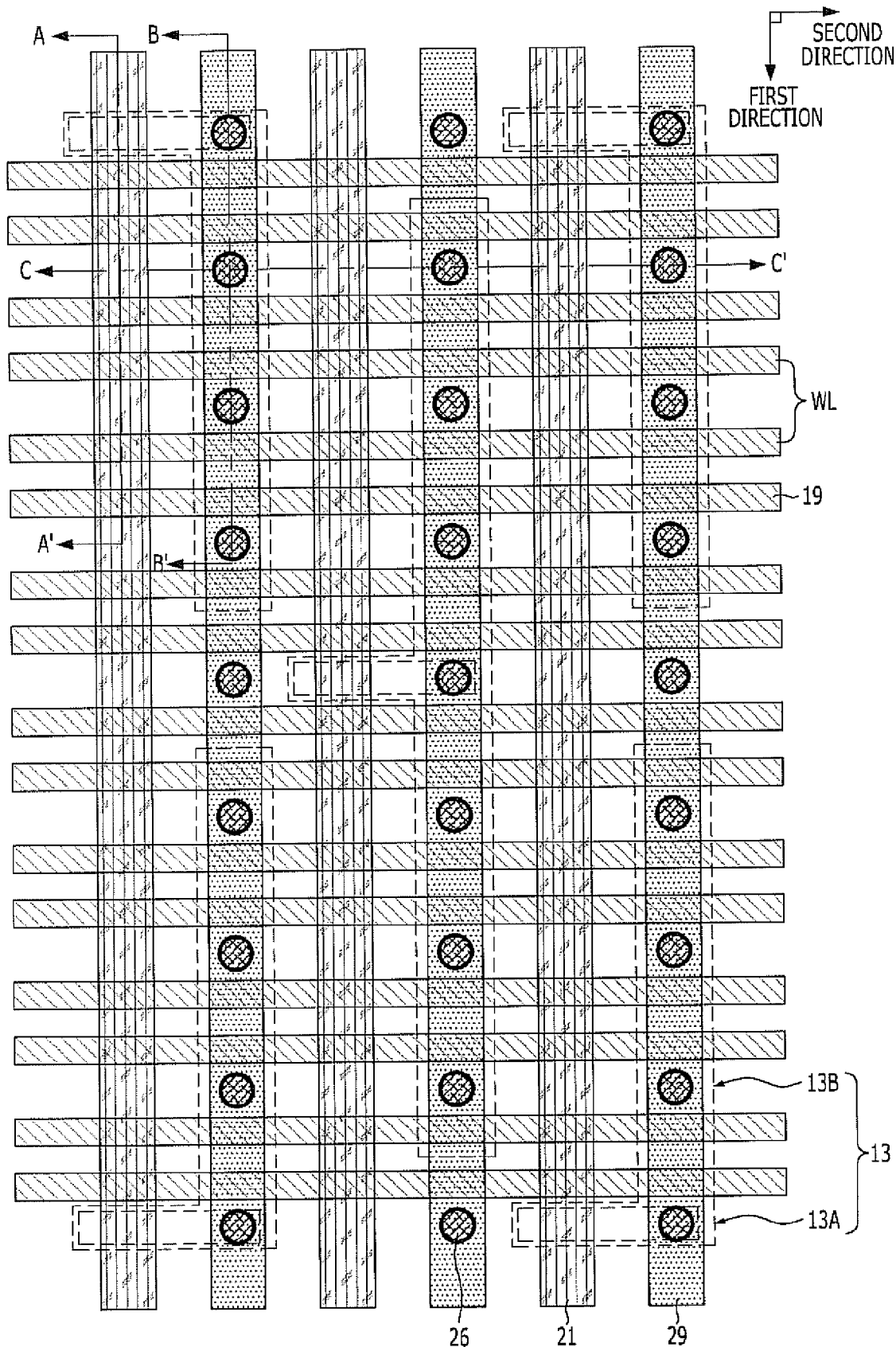
Figure 9B:
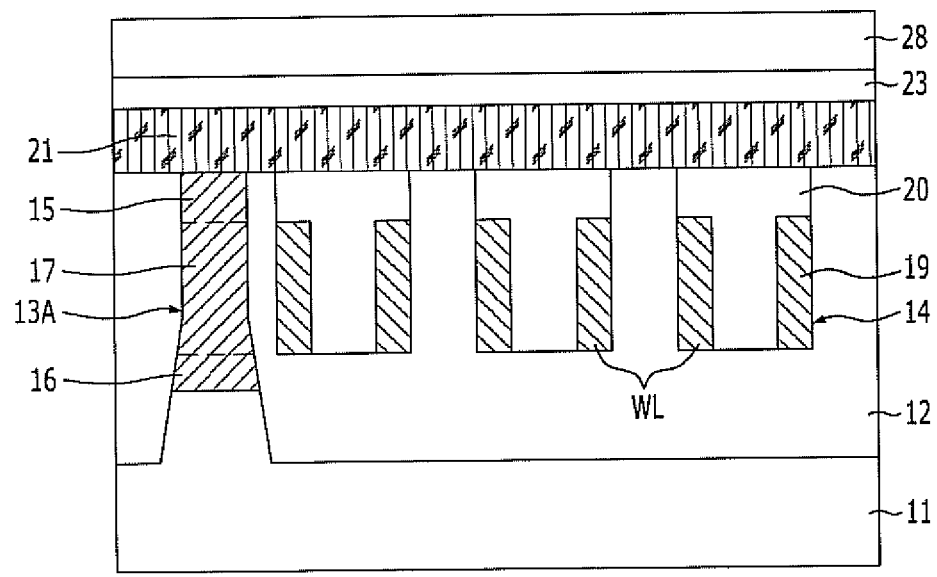
Figure 9C:
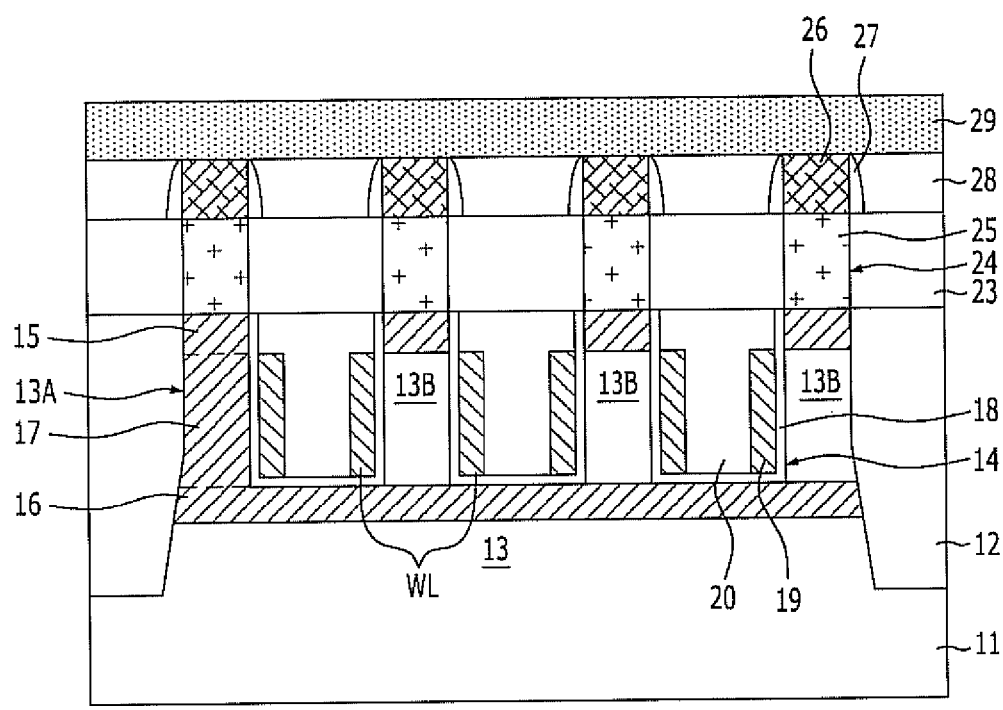
Figure 9D:
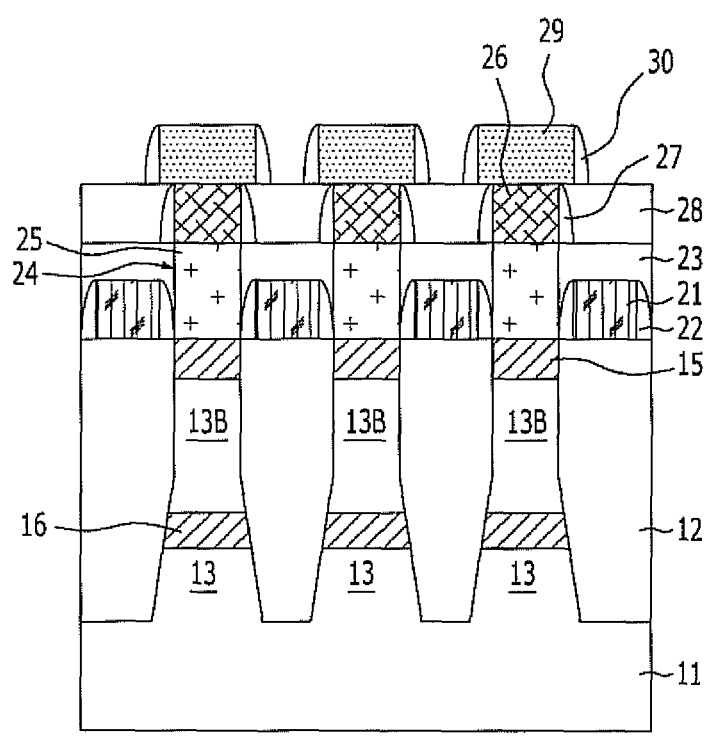

The active regions 13 defined by the isolation layer 12 may be formed as a line extended in the first direction (shown in FIG. 3A). At this time, the active regions 13 are defined by the isolation layer 12 and include an active tab 13A coupled to one end thereof. The active tab 13A may have a structure that protrudes in the second direction (shown in FIG. 3A) to overlap a main source line to be formed by a subsequent process, and may zigzag in and out to secure an adequate distance from adjacent active regions 13. The active tabs 13A are formed to provide a space in which a plug for electrically coupling a sub-source line and a main source line, which are to be formed by a subsequent process, is to be formed.

A hard mask pattern 31 is formed over the substrate 11. Then, the substrate 11 is etched by using the hard mask pattern 31 as at etching barrier to form a trench 14 crossing both of the isolation layer 12 and the active region 13. At this time, as the trench 14 is formed, a part of the active region 13 is defined as an active pillar 13B by the isolation layer 12 and the trenches 14.

The trench 14 may be formed as a line type extended in the second direction and provides a space in which a gate electrode serving as a word line is to be formed. Therefore, the depth of the trench 14 may be adjusted according to the channel length of a switching element and may be set to be smaller than the thickness of the isolation layer 12 based on the upper surface of the substrate 11.

Referring to FIGS. 4A to 4D, ion impurities are implanted into the substrate 11 under the trench 14 by using the hard mask pattern 31 as an ion implantation barrier, and a heat treatment is then performed to form a sub-source line 16 as a line extended in the first direction. At this time, a sub-source line 16 crossing under the active pillar 13B also serves as a junction region of the vertical transistor.

When ion impurity implantation is performed on the entire surface of the substrate 11, the ion impurities are locally implanted into only the substrate 11 under the trench 14 by the hard mask pattern 31 (refer to portions indicated by dotted lines). While the implanted ion impurities are activated and diffused through the heat treatment, the sub-source line 16 is formed as a line type extended in the first direction. At this time, the isolation layer 12 prevents the ion impurities from being diffused in the second direction, and electrically isolates the sub-source line 16 from another adjacent sub-source line adjacent in the second direction.

The hard mask pattern 31 is removed.

Referring to FIGS. 5A to 5D, a gate dielectric layer 18 is formed on the surface of the trench 14. The gate dielectric layer 18 may be formed of an oxide layer, and a silicon oxide layer ($SiO_2$) may be used as the oxide layer. The silicon oxide layer used as the gate dielectric layer 18 may be formed by using a thermal oxidation method, and the gate dielectric layer 18 is not formed on the isolation layer 12 due to the characteristics of the thermal oxidation method.

A gate electrode 19 is formed on both sidewalls of the trench 14. At this time, the gate electrode 19 may include a single layer formed of a silicon layer or metallic layer or a stacked layer of a silicon layer and a metallic layer. According to an example, the metallic layer includes a metal layer, a metal oxide layer, a metal nitride layer, and a metal silicide layer.

The gate electrode 19 serves as a word line, and may be formed as a line extended in the second direction. Therefore, the gate electrode 19 is formed on both sidewalls of the active pillar 13B, and two gate electrodes 19 formed on both sidewalls of the active pillar 13B serve as one word line WL. The upper surface of the gate electrode 19 may be formed lower than the upper surface of the substrate 11. Then, insulation between the gate electrode 19 and the structure to be formed through a subsequent process may be stably performed, a process margin may be secured for the subsequent process, and the occurrence of leakage current caused by the interference with a first impurity region 15 may be suppressed.

The gate electrode 19 having the above-described structure may be formed by the following processes. First, a gate conductive layer is formed on the entire surface of the substrate 11 so as to fill the trench 14, and a planarization process is performed until the surface of the substrate 11 is exposed. Then, the gate conductive layer is recess-etched to partially remain on the sidewalls of the trench 14.

A sealing layer 20 is formed to fill the trench 14. The sealing layer 20 serves to not only protect the gate electrode 19, but also electrically isolate the gate electrode 19 from an adjacent gate electrode 19. The sealing layer 20 may be formed of an insulation layer. Specifically, the sealing layer 20 may include any one single layer selected from the group consisting of oxide layer, nitride layer, and oxynitride layer or a stacked layer of two or more layers selected from the group. The sealing layer 20 may be formed by the following processes. First, an insulation layer is deposited on the entire surface of the substrate 11 so as to fill the trench 14. Then, a planarization process is performed until the substrate 11 is exposed.

The first impurity region 15 is formed by implanting ion impurities to the exposed surface of the active pillar 13B and the active tab 13A. At this time, the first impurity region 15 formed on the surface of the active pillar 13B serves as a junction region of the vertical transistor. Specifically, when the sub-source line 16 serves as a source of the vertical transistor, the first impurity region 15 serves as a drain of the vertical transistor, which operates as an access transistor to a memory cell.

A second impurity region 17 is formed by implanting ion impurities into the active tab 13A to couple the first impurity region 15 formed on the surface of the active tab 13A to the sub-source line 16. The second impurity region 17 serves as a plug which electrically couples the sub-source line 16 to a main source line to be formed by a subsequent process. The second impurity region 17 may be formed by implanting the same ion impurities as the first impurity region 15 and the sub-source line 16.

Meanwhile, the formation process of the second impurity region 17 which is formed in the active tab 13A and serves as a plug for coupling the sub-source line 16 to a main source line to be formed by a subsequent process may be performed at the same time as the formation process of the first impurity region 15.

Referring to FIGS. 6A to 6D, the main source line 21 formed as a line type extended in the first direction is formed on the substrate 11. At this time, the main source line 21 may be formed to have a lower resistance than the sub-source line 16 including an impurity region and thus reduce the total resistance of the source line. Therefore, the main source line 21 may be formed of a metallic layer and is coupled to the first impurity region 15 formed in the active tab 13A. Here, an ohmic contact layer may be formed between the main source line 21 and the first impurity region 15 to reduce the contact resistance between the first impurity region 15 and the main source line 21. While the ohmic contact layer is not illustrated in the drawings, it may be formed of a metal silicide layer according to an example.

As discussed above, the main source line 21 has lower resistance than the sub-source line 16 formed in the substrate 11, where the sub-source line 16 may be formed for each mat and the main source line 21 may be formed for each bank. More specifically, the main source line 21 may be formed to be coupled to a plurality of sub-source lines 16 through the second impurity region 17. Here, the sub-source line 16 having a relatively high resistance is disposed for each mat to prevent the resistance of the sub-source line 16 from increasing, and the main source line 21 having a relatively low resistance is disposed for each bank and coupled to a plurality of sub-source line 16. Therefore, the resistance of the entire source line may be reduced to substantially prevent the degradation of operation characteristics of the semiconductor memory device caused by a voltage drop and a reduction in interconnection reliability.

A first spacer 22 (shown in FIG. 6D) is formed on both sidewalls of the main source line 21. The first spacer 22 serves to not only protect the main source line 21, but also insulate the main source line 21 from a plug to be formed by a subsequent process. The first spacer 22 may include any one single layer selected from the group consisting of oxide layer, nitride layer, and oxynitride layer or a stacked layer of two or more layers selected from the group.

Referring to FIGS. 7A to 7D, a first interlayer dielectric layer 23 (shown in FIG. 7B) is formed over the entire surface of the substrate 11 so as to cover the main source line 21. The first interlayer dielectric layer 23 may include any one selected from the group consisting of oxide layer, nitride layer, and oxynitride layer and may be formed of a metal having an etching selectivity with the sealing layer 20.

The first interlayer dielectric layer 23 is selectively etched to form a contact hole 24 to expose the first impurity region 15, and a contact plug 25 is then formed to fill the contact hole 24. Here, in order to reduce contact resistance between the first impurity region 15 and the contact plug 25, an ohmic contact layer may be formed therebetween. While the ohmic contact layer is not illustrated in the drawings, it may be formed of a metal silicide layer according to an example.

Referring to FIGS. 8A to 8D, a variable resistor pattern 26 is formed on the first interlayer dielectric layer 23 (shown in FIG. 8B) so as contact the contact plug 25. The variable resistor pattern 26 means a pattern capable of switching between at least two resistance states through an externally applied bias voltage. The variable resistor pattern 26 which may be applied to the embodiment of the present invention is described in detail with reference to FIGS. 10A to 10D.

Meanwhile, before the variable resistor pattern 26 is formed, an ohmic contact layer may be formed between the contact plug 25 and the variable resistor pattern 26 to reduce the contact resistance therebetween. While the ohmic contact layer is not illustrated in the drawings, it may be formed of a metal silicide layer according to an example.

A second spacer 27 is formed on sidewalls of the variable resistor pattern 26. The second spacer 27 serves to protect the variable resistor pattern 26 during a subsequent process and may include any one single layer selected from the group consisting of oxide layer, nitride layer, and oxynitride layer or a stacked layer of two or more layers selected from the group.

Referring to FIGS. 9A to 9D, a second interlayer dielectric layer 28 is formed on the first interlayer dielectric layer 23 so as to cover the variable resistor pattern 26. The second interlayer dielectric layer 28 may include any one selected from the group consisting of oxide layer, nitride layer, and oxynitride layer and may be formed of the same material as the first interlayer dielectric layer 23.

A planarization process is performed until the variable resistor pattern 26 is exposed so that the second interlayer dielectric layer 28 fills the spaces between the variable resistor patterns 26. At this time, the planarization process may be performed by using a chemical mechanical polishing (CMP) process.

A bit line 29 is formed on the second interlayer dielectric layer 28. The bit line 29 is extended in the first direction and is formed over a plurality of variable resistor patterns 26 connected to the same bit line 29. According to an example, the bit line 29 may be formed of a metallic layer. In order to reduce contact resistance between the bit line 29 and the variable resistor patterns 26, an ohmic contact layer may be formed therebetween.

A third spacer 30 is formed on both sidewalls of the bit line 29. The third spacer 30 serves to protect the bit line 29, and may include any one single layer selected from the group consisting of oxide layer, nitride layer, and oxynitride layer or a stacked layer of two or more layers selected from the group.

The semiconductor memory device having the above-described structure is provided with the vertical transistor including the active pillars 13B, the gate electrodes 19 formed on both sidewalls of the active pillars 13B, the first impurity regions 15 formed on the active pillars 13B, and the sub-source lines 16 formed in the substrate 11 and under the active pillars 13B. Therefore, a semiconductor memory device having a cell size of $6F^2$ or less (for example, $4F^2$). Furthermore, although the semiconductor memory device have a structure in which the sub-source lines 16 and main source lines 21 are arranged in parallel to the bit line 29 and arranged to cross the word line WL, the structure of the semiconductor memory device and the fabrication process may be simplified because the word line WL is buried in the substrate 11 and the sub- and main source lines 16 and 21 are provided. Accordingly, the integration degree of the semiconductor memory device may be increased, and the production cost may be reduced. Furthermore, by using a vertical transistor, the operation characteristics of the semiconductor memory device may be substantially prevented from being degraded by a short channel effect, the driving speed of the semiconductor memory device may be increased, and the power consumption may be reduced.

Furthermore, the semiconductor memory device in accordance with the embodiment of the present invention includes the sub-source line 16 formed in the substrate 11 and the main source line 21 formed over the substrate 11. Therefore, a voltage drop and a reduction in interconnection reliability may be substantially prevented, which may occur when all memory cells coupled to any one word line WL receive signals through one source line. Furthermore, since the sub-source lines 16 and main source lines 21 are arranged in parallel to the bit line 29 and arranged to cross the word line WL, a voltage drop of the source line and a reduction in interconnection reliability may be prevented.

FIGS. 10A to 10D are cross-sectional views illustrating variable resistor patterns which may be applied to the semiconductor memory device in accordance with exemplary embodiments of the present invention.

Figure 10A:
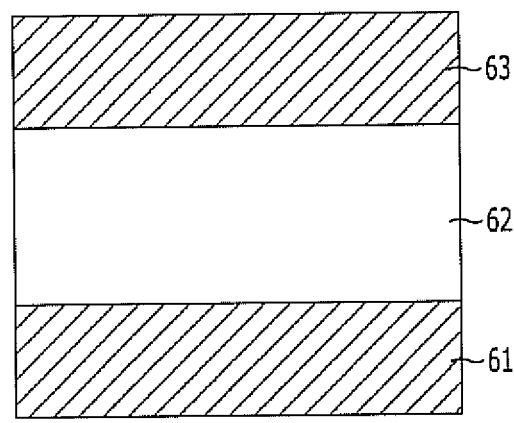
FIGS. 10A to 10D are cross-sectional views illustrating variable resistor patterns which may be applied to the semiconductor memory device in accordance with exemplary embodiments of the present invention.

Referring to FIG. 10A, the variable resistor pattern may have a structure in which a first electrode 61, a phase change material layer 62, and a second electrode 62 are sequentially stacked.

The resistance value of the phase change material layer 62 changes while the crystalline state of the phase change material layer 62 is changed into an amorphous state (that is, a high resistance state) or crystal state (that is, a lower resistance state) according to an external stimulus, for example, a current or voltage. At this time, the phase change material layer 62 may have a plurality of resistance values depending on the degree of change in the phase change material layer 62 into an amorphous state or crystal state. Furthermore, a plurality of structures in which the first electrode 61, the phase change material layer 62, and the second electrode 63 are stacked may be coupled in series to provide a plurality of resistance values.

The phase change material layer 62 may be formed of a chalcogen compound. The chalcogen compound which may be used for the phase change material layer 62 may include Ge—Sb—Te, As—Sb—Te, Sn—Sb—Te, Sn—In—Sb—Te, As—Ge—Sb—Te, group V element-Sb—Te, group VI element-Sb—Te, group VA element-Sb—Se, or group VIA element-Sb—Se. The group VA element includes Ta, Nb, and V, and the group VI element includes W, Mo, and Cr. Typically, 'GST' in which Ge, Sb, and Te are mixed at a desired ratio is used as the phase change material layer 302.

Figure 10B:
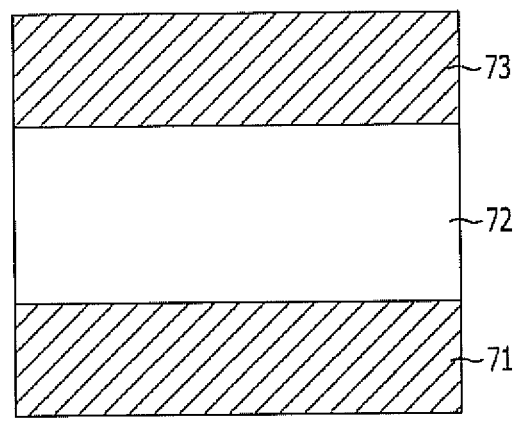

Referring to FIG. 10B, a variable resistor pattern may have a structure in which a first electrode 71, a variable resistor pattern 72, and a second electrode 73 are sequentially stacked.

A perovskite-based material or a binary oxide including a transition metal oxide (TMO) may be used as the variable resistor pattern 72. Specifically, the perovskite-based material may include STO (SrTiO), PCMO (PrCaMnO) and so on, and the binary oxide may include Ni oxide, Ti oxide, Hf oxide, Zr oxide, W oxide, Co oxide and so on.

When the variable resistor layer 72 is formed of TMO, the variable resistor layer 72 includes a plurality of oxygen vacancies therein. When an external stimulus, for example, a current or voltage is applied, the oxygen vacancies within the variable resistor layer 72 may be rearranged. In this case, the resistance value of the variable resistor layer 72 changes depending on whether or not conductive filaments are generated by the rearrangement of the oxygen vacancies. At this time, the variable resistor layer 72 may have a plurality of resistance values depending on how many conductive filaments are generated. Furthermore, a plurality of structures in which the first electrode 71, the phase change material layer 72, and the second electrode 73 are stacked may be coupled in series to provide a plurality of resistance values.

Figure 10C:
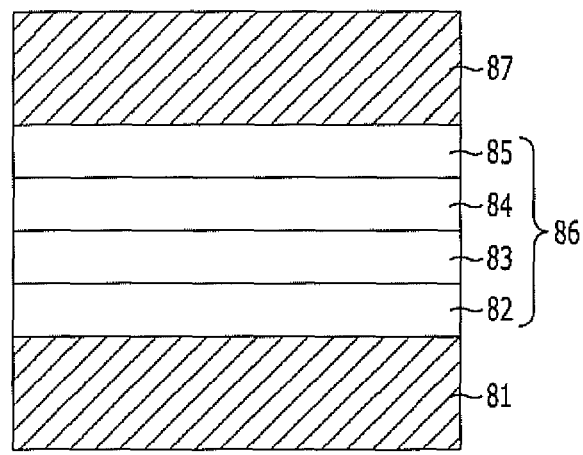

Referring to FIG. 10C, the variable resistor pattern may have a structure in which a first electrode 81, a magnetic tunnel junction layer 86, and a second electrode 87 are sequentially stacked.

The magnetic tunnel junction layer 86 may include a stacked layer of a pinning layer 82, a pinned layer 83, a tunnel insulator 84, and a free layer 85. At this time, the resistance value of the magnetic tunnel junction layer 86 is changed by an external stimulus, for example, a magnetic field or spin transfer torque (STT), depending on the magnetization direction of the free layer 85. At this time, the magnetic tunnel junction layer 86 may have a plurality of resistance values depending on how much the magnetization direction of the free layer 85 is changed. Furthermore, a plurality of structures in which the first electrode 81, the magnetic tunnel junction layer 86, and the second electrode 87 are stacked as a structure may be coupled in series to provide a plurality of resistance values.

The pinning layer 82 serves to fix the magnetization direction of the pinned layer 83 and may be formed of an anti-ferromagnetic material. The anti-ferromagnetic material may include IrMn, PtMn, MnO, MnS, MnTe, $MnF_2$, $FeF_2$, $FeCl_2$, FeO, $CoCl_2$, CoO, $NiCl_2$, or NiO.

The pinned layer 83 and the free layer 85 may be formed of a ferromagnetic material. The ferromagnetic material may include Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_2O_{12}$.

The tunnel insulation layer 84 serves as a tunneling barrier between the pinned layer 83 and the free layer 85 and may be formed of MgO, $Al_2O_3$, $Si_3N_4$, SiON, $SiO_2$, $HfO_2$, or $ZrO_2$. In addition, all materials having an insulation property may be used as the tunnel insulation layer 84.

Figure 10D:
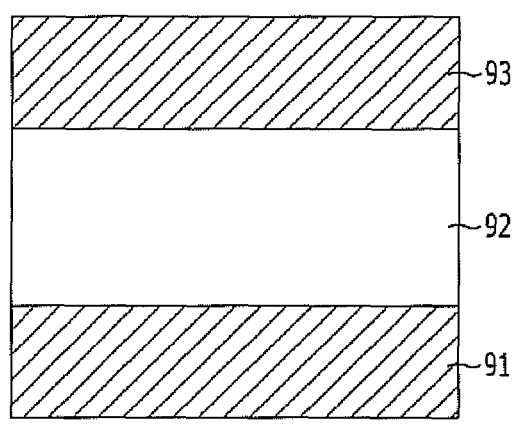

Referring to FIG. 10D, a variable resistance pattern may have a structure in which a first electrode 91, a ferroelectric layer 92, and a second electrode 93 are sequentially stacked.

The ferroelectric layer 92 has a spontaneous polarization and causes polarization reversal through an external stimulus to change the resistance value of the ferroelectric layer 92. At this time, the ferroelectric layer 92 may have a plurality of resistance values depending on how much the spontaneous polarization of the ferroelectric layer 92 is changed. Furthermore, a plurality of structures in which the first electrode 91, the ferroelectric layer 92, and the second electrode 93 are stacked may be coupled in series to provide a plurality of resistance values. The ferroelectric layer 92 may be formed of SBT (SrBiTa) or BLT (BiLaTi).

In accordance with exemplary embodiments of the present invention, the semiconductor memory device is provided with the vertical transistor including the active pillar serving as a switching element and the word line (or gate electrode) formed on both sidewalls of the active pillar. Therefore, a semiconductor memory device having a cell size of $4F^2$ may be implemented. Furthermore, by using a vertical transistor, the degradation of operation characteristics of the semiconductor memory device caused by a short channel effect may be substantially prevented. Furthermore, the driving speed of the semiconductor memory device may be increased, and the power consumption may be reduced.

Furthermore, although the semiconductor memory device has such a structure that the sub-source lines and main source lines are arranged in parallel to the bit line and arranged to cross the word line, the structure of the semiconductor memory device may be simplified and the fabrication process may be simplified because the word line is buried in the substrate and the sub-source lines and main source lines are provided.

Furthermore, as the sub-source line formed in the substrate and the main source line formed over the substrate are provided, a voltage drop and a reduction in interconnection reliability may be prevented, where the voltage drop may occur when all memory cells coupled to any one word line WL receive signals through one source line.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   an isolation layer formed in a substrate and defining an active region;
   a trench formed in the substrate and defining a part of the active region as an active pillar;
   a word line formed inside the trench;
   a sub-source line formed under the trench and crossing the word line;
   a main source line formed over the substrate, coupled to the sub-source line, and crossing the word line;
   a variable resistor pattern formed over the active pillar; and
   a bit line contacting the variable resistor pattern and crossing the word line.

2. The semiconductor memory device of claim 1, further comprising:
   an active tab contacting an end of the active region; and
   an impurity region formed in the active tab and electrically coupling the sub-source line and the main source line.

3. The semiconductor memory device of claim 2, wherein the active tab extends in a direction crossing the active region so as to overlap the main source line.

4. The semiconductor memory device of claim 1, further comprising:
   a gate dielectric layer inserted between the trench and the word line; and
   a sealing layer gap-filling the trench.

5. The semiconductor memory device of claim 4, further comprising a gate electrode unit formed to contact both sidewalls of the trench,
   wherein the word line comprises the gate electrode unit contacting both sidewalls of the active pillar.

6. The semiconductor memory device of claim 4, wherein the word line comprises a gate electrode contacting a sidewall of the trench.

7. The semiconductor memory device of claim 5, wherein an upper surface of the gate electrode is lower than an upper surface of the substrate.

8. The semiconductor memory device of claim 1, further comprising:
   an impurity region formed over a surface of the active pillar; and
   an ohmic contact layer formed over the impurity region.

9. The semiconductor memory device of claim 1, wherein the trench comprises a line pattern crossing both of the active region and the isolation layer.

10. The semiconductor memory device of claim 1, wherein the sub-source line comprises an impurity region formed in the substrate and under the trench.

11. The semiconductor memory device of claim 1, wherein the sub-source line and an adjacent sub-source line are isolated by the isolation layer in a direction where the word line is extended.

12. The semiconductor memory device of claim 1, wherein the main source line comprises a metallic layer.

13. The semiconductor memory device of claim 1, wherein the sub-source line is disposed for each mat and the main source line is disposed for each bank.

14. The semiconductor memory device of claim 1, wherein the variable resistor pattern comprises any one selected from the group consisting of a phase change material layer, a variable resistor layer, a magnetic tunnel junction layer, and a ferroelectric layer.

15. A semiconductor memory device comprising:
   an isolation layer formed in a substrate and defining an active region;
   a trench formed in the substrate and defining a part of the active region as an active pillar;
   a word line formed inside the trench;

a plurality of sub-source lines formed under the trench and arranged to each provide a source line voltage to a subset of a set of memory cells; and a main source line formed over the trench coupled to each of the sub-source lines, wherein the main source line provides the source line voltage to each of the sub-source lines.

16. The semiconductor memory device of claim 15, wherein the active pillar has gate electrodes formed on opposite sides of the active pillar and the gate electrodes are arranged to be coupled to a same word line.

17. The semiconductor memory device of claim 15, wherein main source line and the sub-source line extend as parallel lines and the sub-source line is coupled to provide the source line voltage received through the main source line to a drain of an access transistor of a memory cell.

* * * * *